US012604471B2

(12) United States Patent
Lee

(10) Patent No.: US 12,604,471 B2
(45) Date of Patent: Apr. 14, 2026

(54) SEMICONDUCTOR MEMORY DEVICE AND MANUFACTURING METHOD OF SEMICONDUCTOR MEMORY DEVICE

(71) Applicant: SK hynix Inc., Icheon-si Gyeonggi-do (KR)

(72) Inventor: Kun Young Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 678 days.

(21) Appl. No.: 17/972,859

(22) Filed: Oct. 25, 2022

(65) Prior Publication Data

US 2023/0380160 A1     Nov. 23, 2023

(30) Foreign Application Priority Data

May 19, 2022     (KR) ........................ 10-2022-0061672

(51) Int. Cl.
| | |
|---|---|
| *H10B 43/10* | (2023.01) |
| *G11C 16/04* | (2006.01) |
| *H01L 23/528* | (2006.01) |
| *H10B 41/10* | (2023.01) |
| *H10B 41/27* | (2023.01) |
| *H10B 43/27* | (2023.01) |

(52) U.S. Cl.
CPC ......... *H10B 43/27* (2023.02); *G11C 16/0483* (2013.01); *H01L 23/5283* (2013.01); *H10B 41/10* (2023.02); *H10B 41/27* (2023.02); *H10B 43/10* (2023.02)

(58) Field of Classification Search
CPC ...................................................... H10B 43/10
See application file for complete search history.

(56) References Cited

U.S. PATENT DOCUMENTS

| | | | |
|---|---|---|---|
| 9,147,468 B1 | 9/2015 | Lue | |
| 9,397,110 B2 | 7/2016 | Lue | |
| 2016/0260725 A1 | 9/2016 | Jung | |
| 2017/0062456 A1 | 3/2017 | Sugino et al. | |
| 2017/0148805 A1 | 5/2017 | Nishikawa et al. | |
| 2020/0083248 A1* | 3/2020 | Uchida ................... | H10B 43/35 |
| 2020/0126628 A1* | 4/2020 | Maejima ............ | G11C 16/3454 |
| 2022/0005821 A1* | 1/2022 | Or-Bach ............... | H10B 43/27 |

FOREIGN PATENT DOCUMENTS

| | | |
|---|---|---|
| CN | 112470276 A | 3/2021 |
| KR | 1020180008959 A | 1/2018 |
| KR | 1020220043370 A | 1/2018 |
| KR | 1020190115754 A | 10/2019 |
| KR | 1020210010210 A | 1/2021 |
| KR | 1020210055866 A | 5/2021 |

* cited by examiner

*Primary Examiner* — Christopher A Johnson
(74) *Attorney, Agent, or Firm* — WILLIAM PARK AND ASSOCIATES LTD.

(57) ABSTRACT

There are provided a semiconductor memory device and a manufacturing method of a semiconductor memory device. The semiconductor memory device may include a stack structure including a plurality of conductive layers, a hole formed in the stack structure, a memory layer allowing a first part and a second part of the hole to be spaced apart from each other in the hole, and a first channel layer disposed in the first part of the hole and a second channel layer disposed in the second part of the hole.

19 Claims, 32 Drawing Sheets

DPS

IIIa'

IIIa

IIa'

Ia'

IIa

Ia

IIa

Figures 18, 19:
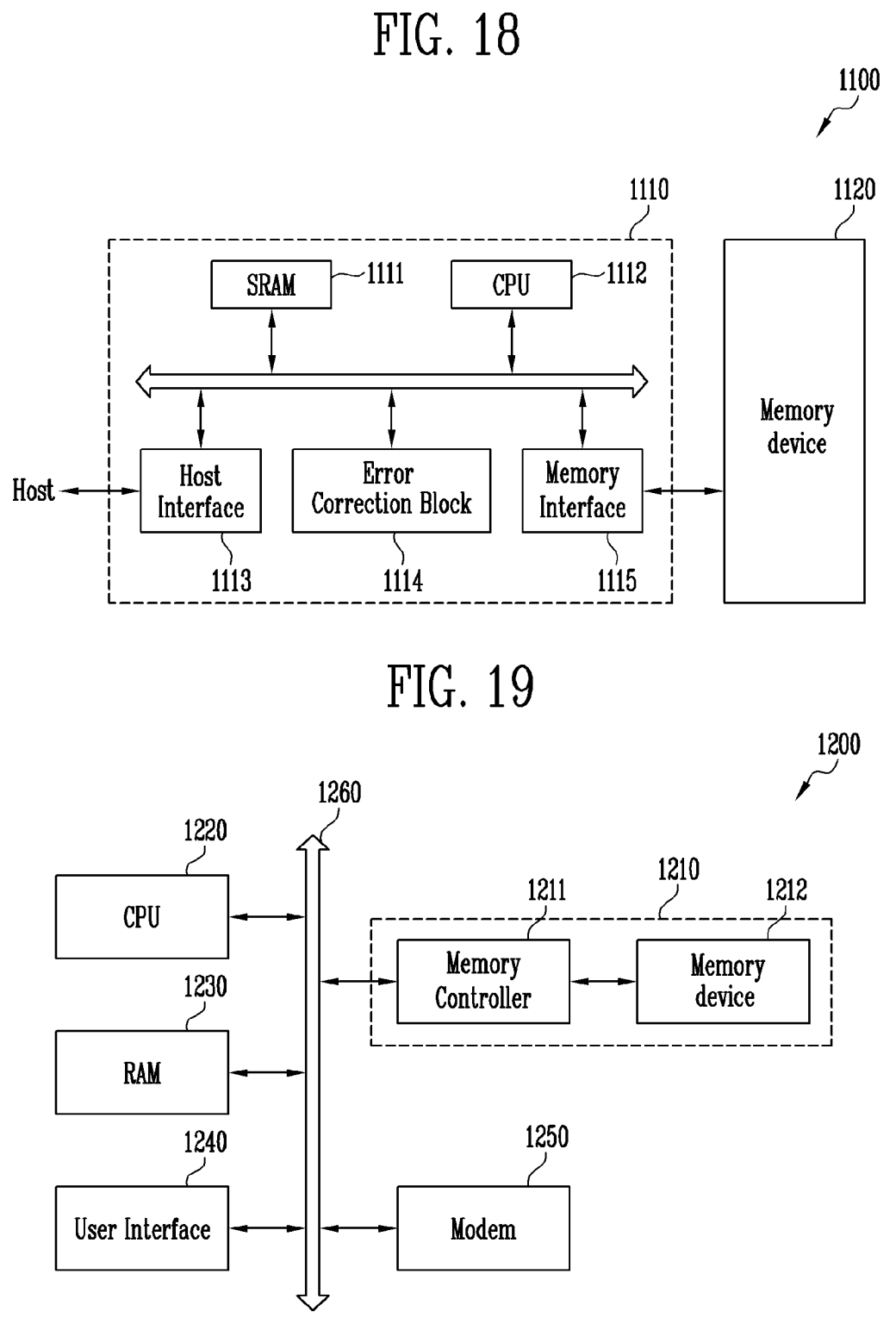

| SRAM | 1111 | CPU | 1112 |

Memory device

Host

| Host Interface | Error Correction Block | Memory Interface |

CPU

1230

RAM

1240

User Interface 1211    1210    1212

| Memory Controller | Memory device |

1250

Modem

SEMICONDUCTOR MEMORY DEVICE AND
MANUFACTURING METHOD OF
SEMICONDUCTOR MEMORY DEVICE

CROSS-REFERENCE TO RELATED
APPLICATION

The present application claims priority under 35 U.S.C. § 119(a) to Korean patent application number 10-2022-0061672, filed on May 19, 2022, in the Korean Intellectual Property Office, the entire disclosure of which is incorporated herein by reference.

BACKGROUND

1. Technical Field

The present disclosure generally relates to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device may include a plurality of memory cells capable of storing data. A plurality of memory cells of a three-dimensional semiconductor memory device may be three-dimensionally arranged. In the three-dimensional semiconductor memory device, the plurality of memory cells may be connected in series by a channel structure formed in a gate stack structure.

SUMMARY

In accordance with an embodiment of the present disclosure, there may be provided a semiconductor memory device including: a stack structure including a plurality of conductive layers, each of the plurality of conductive layers having a surface facing a first direction and the plurality of conductive layers being spaced apart from each other in the first direction; a hole formed in the stack structure, the hole including a first part and second part that are adjacent to each other in a second direction that is perpendicular to the first direction, wherein the hole has a width that is narrower closer to a connection point between the first part and the second part; a first channel layer in the first part of the hole; a second channel layer in the second part of the hole; and a memory layer interposed between the first channel layer and the second channel layer and extending into a space between the stack structure and each of the first and second channel layers.

In accordance with an embodiment of the present disclosure, there may be provided a semiconductor memory device including: a stack structure including a plurality of conductive layers that are spaced apart from each other; a butterfly-shaped hole formed in the stack structure; a memory layer extending along a sidewall of the butterfly-shaped hole, the memory layer isolating a first region and a second region in the butterfly-shaped hole; a first channel layer in the first region; and a second channel layer in the second region.

In accordance with an embodiment of the present disclosure, there may be provided a method of manufacturing a semiconductor memory device, the method including: forming a stack structure over a lower structure; forming a hole in the stack structure, wherein the hole includes a first part and a second part that are adjacent to each other in a plan view, a width of the first part and a width of the second part becoming narrower closer to a connection point between the first part and the second part; forming a memory layer that is disposed at the connection point between the first part and the second part of the hole, the memory layer extending along a sidewall of each of the first part and the second part of the hole; and forming a first channel layer and a second channel layer in the first part and the second part of the hole, respectively, the first part and the second part of the hole being isolated from each other by the memory layer.

BRIEF DESCRIPTION OF THE DRAWINGS

Various examples of embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or additional intervening elements may also be present. Like reference numerals refer to like elements throughout the drawings.

FIG. 1 is a block diagram illustrating a semiconductor memory device in accordance with an embodiment of the present disclosure.

FIGS. 5A, 5B, and 5C are sectional views illustrating a semiconductor memory device in accordance with an embodiment of the present disclosure.

FIGS. 15A, 15B, 16A, 16B, and 17 are views illustrating a manufacturing method of a semiconductor memory device in accordance with an embodiment of the present disclosure.

FIG. 18 is a block diagram illustrating a configuration of a memory system in accordance with an embodiment of the present disclosure.

FIG. 19 is a block diagram illustrating a configuration of a computing system in accordance with an embodiment of the present disclosure.

DETAILED DESCRIPTION

Figure 2:
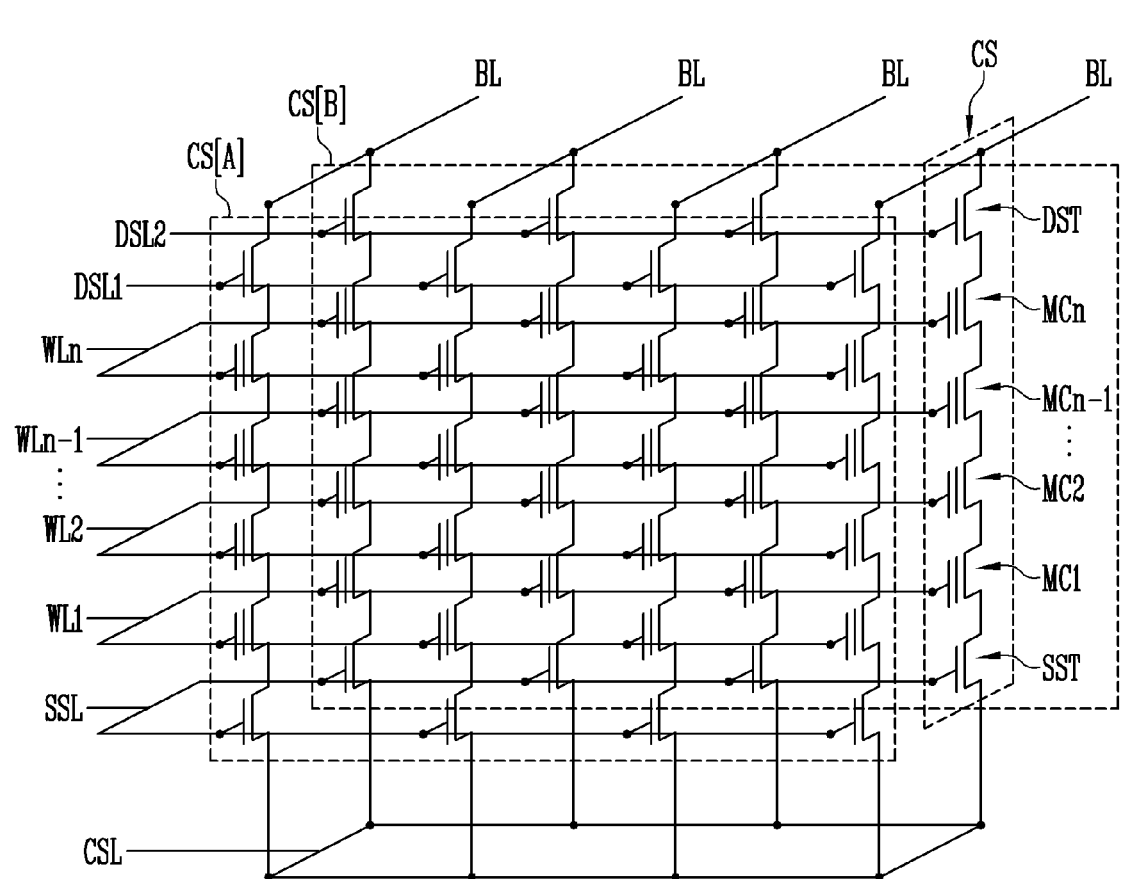
FIG. 2 is a circuit diagram illustrating a memory cell array in accordance with an embodiment of the present disclosure.

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Embodiments provide a semiconductor memory device and a manufacturing method of a semiconductor memory device, which can improve operational reliability.

Figure 1:
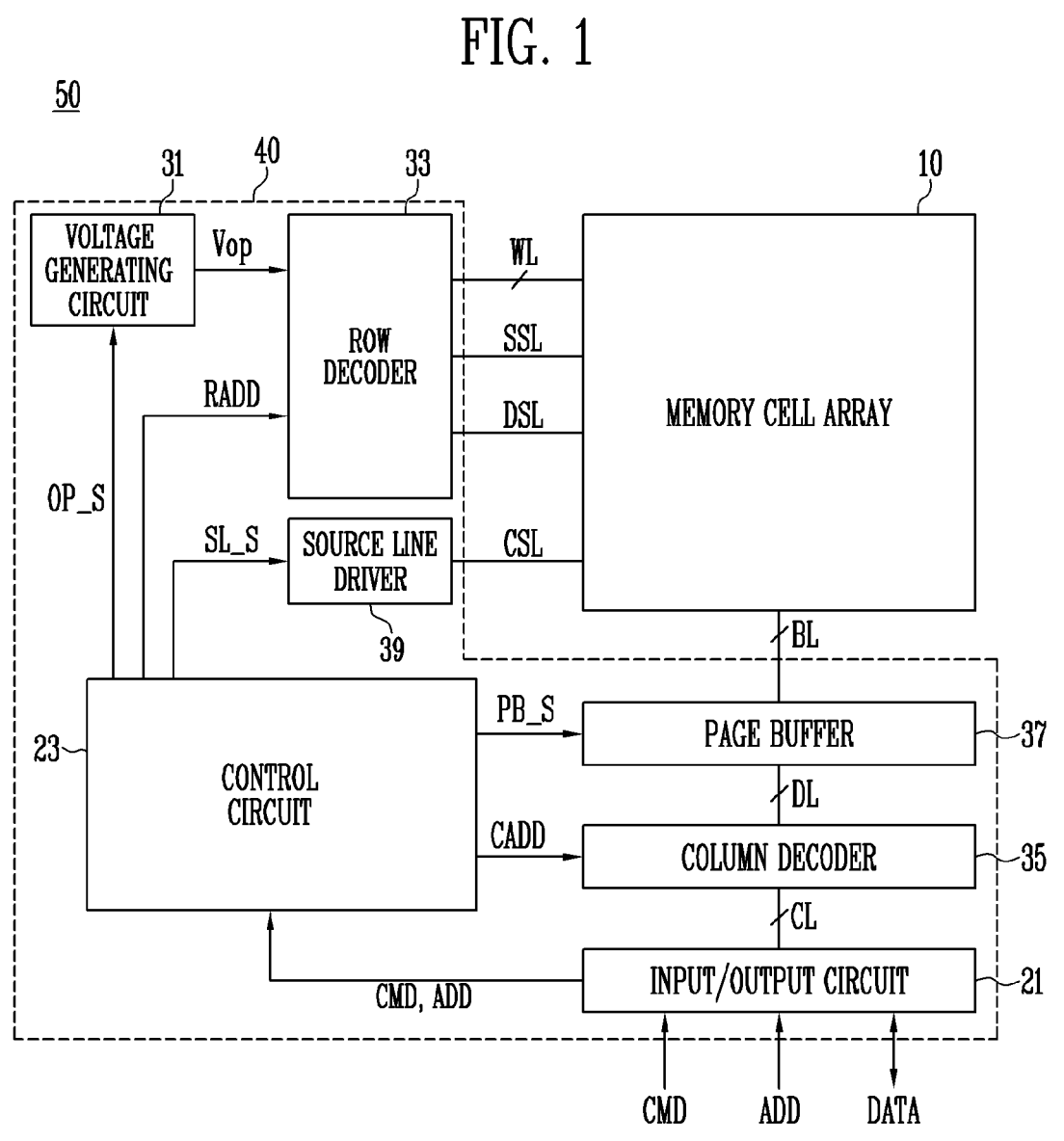

FIG. 1 is a block diagram illustrating a semiconductor memory device in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data that is stored in the memory cell array 10, and an erase operation for erasing data that is stored in the memory cell array 10. In an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may be connected to the peripheral circuit structure 40 through a common source line CSL, a bit line BL, a drain select line DSL, a word line WL, and a source select line SSL.

The input/output circuit 21 may transfer, to the control circuit 23, a command CMD and an address ADD, which are received from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop that are used for a program operation, a read operation, and an erase operation in response to the operation signal OP_S.

The row decoder 33 may transfer the operating voltages Vop to the drain select line DSL, the word line WL, and the source select line SSL in response to the row address RADD.

The column decoder 35 may transmit data DATA that is input from the input/output circuit 21 to the page buffer 37 or transmit data DATA that is stored in the page buffer 37 to the input/output circuit 21 in response to the column address CADD. The column decoder 35 may exchange data DATA with the input/output circuit 21 through a column line CL. The column decoder 35 may exchange data DATA with the page buffer 37 through a data line DL.

The page buffer 37 may temporarily store data DATA that is received through the bit line BL in response to the page buffer control signal PB_S. The page buffer 37 may sense a voltage or current of the bit line BL in a read operation.

The source line driver 39 may control a voltage that is applied to the common source line CSL in response to the source line control signal SL_S.

FIG. 2 is a circuit diagram illustrating a memory cell array in accordance with an embodiment of the present disclosure.

Referring to FIG. 2, the memory cell array may include a plurality of memory cell strings CS.

Each memory cell string CS may include at least one source select transistor SST, a plurality of memory cells MC1 to MCn, and at least one drain select transistor DST. The plurality of memory cells MC1 to MCn may be connected, in series, between the source select transistor SST and the drain select transistor DST. The source select transistor SST, the plurality of memory cells MC1 to MCn, and the drain select transistor DST may be connected, in series, by a channel structure.

The plurality of memory cell strings CS may be connected, in parallel, to a common source line CSL. Each memory cell string CS may be connected to a corresponding bit line among a plurality of bit lines BL. The common source line CSL and the plurality of bit lines BL may be connected to a plurality of channel structures of the plurality of cell strings CS.

The plurality of memory cells MC1 to MCn of each memory cell string CS may be connected to the common source line CSL via the source select transistor SST. The plurality of memory cells MC1 to MCn of each memory cell string CS may be connected to a corresponding bit line BL via the drain select transistor DST.

The memory cell string CS may be connected to a source select line SSL, a plurality of word lines WL1 to WLn, and a drain select line DSL1 or DSL2. The source select line SSL may be used as a gate electrode of the source select transistor SST. The plurality of word lines WL1 to WLn may be used as gate electrodes of the plurality of memory cells MC1 to MCn. The drain select line DSL1 or DSL2 may be used as a gate electrode of the drain select transistor DST.

The plurality of memory cell strings CS may be controlled by each of the plurality of word lines WL1 to WLn. The number of memory cell strings that are controlled by each bit line BL may be two or more. In an embodiment, one memory cell string of a first memory cell string group CS[A] and one memory cell string of a second memory cell string group CS[B] may be connected to each bit line BL. The first memory cell string group CS[A] and the second memory cell string group CS[B] may be individually controlled by drain select lines that are isolated from each other or source select lines that are isolated from each other. In an embodiment, the first memory cell string group CS[A] may be connected to a first drain select line DSL1, and the second memory cell string group CS[B] may be connected to a second drain select line DSL2. The first memory cell string group CS[A] and the second memory cell string group CS[B] may be connected to the same source select line SSL. Hereinafter, for convenience of description, structures of semiconductor memory devices are described based on the example as shown in FIG. 2. However, the embodiment of the present disclosure is not limited thereto. In another embodiment, two or more memory cell string groups that are connected to the same bit line BL may be connected to the same drain select line and may be individually connected to two or more source select lines isolated from each other. In still another embodiment, two or more memory cell string groups that are connected to the same bit line BL may be individually connected to two or more drain select lines that are isolated from each other and may be individually connected to two or more source select lines isolated from each other.

An operating voltage for precharging a channel layer of the memory cell string CS may be applied to the bit line BL.

The bit line BL may be connected to the channel layer of the memory cell string CS through a bit line connection structure.

An operating voltage for discharging a potential of the channel layer of the memory cell string CS may be applied to the common source line CSL. The common source line CSL may be connected to the memory cell string CS through a doped semiconductor structure.

Figure 3A:
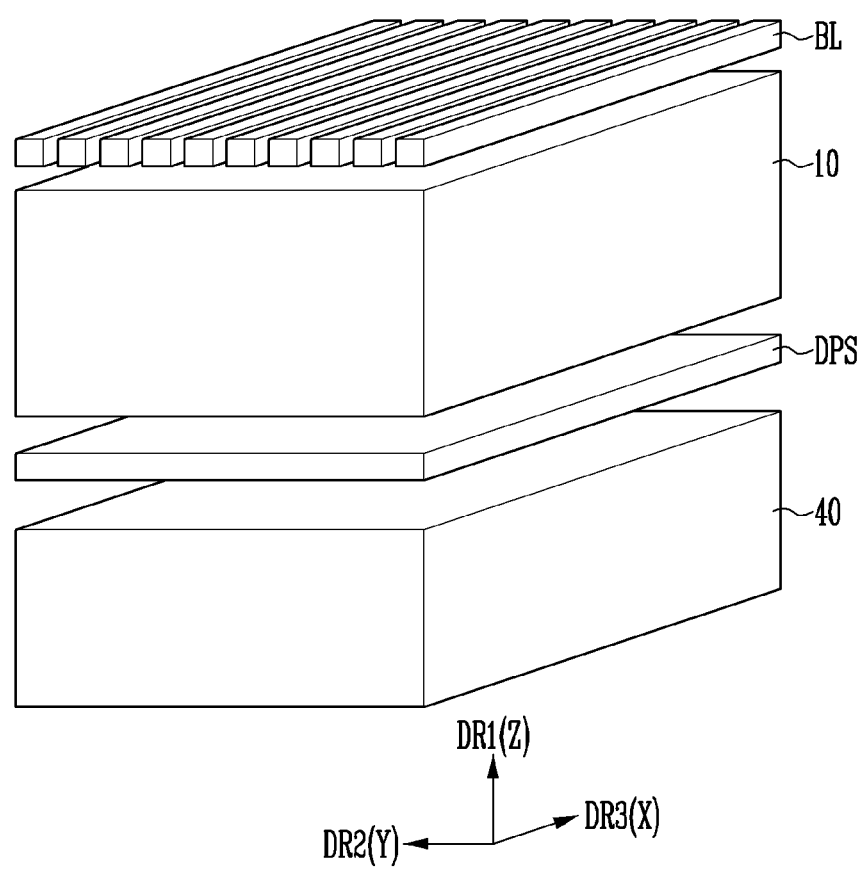
FIGS. 3A and 3B are views schematically illustrating vertical arrangements of a semiconductor memory device in accordance with embodiments of the present disclosure.
Figure 3B:
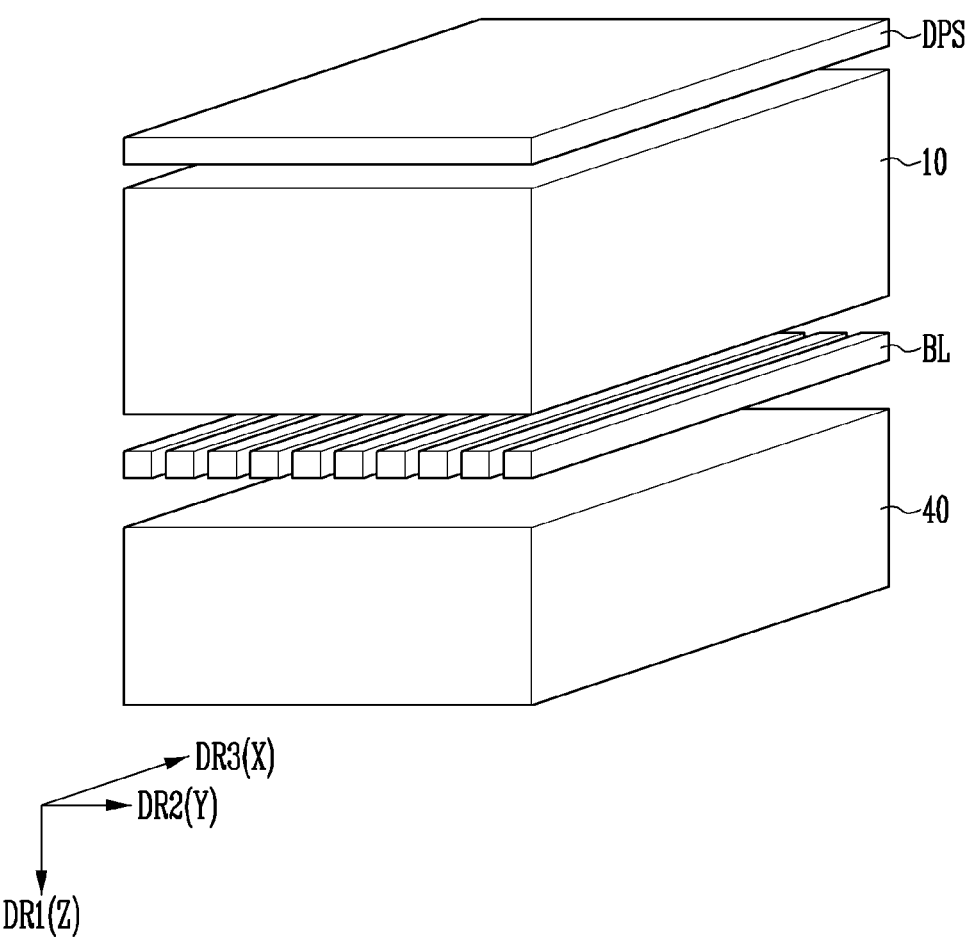

FIGS. 3A and 3B are views schematically illustrating vertical arrangements of a semiconductor memory device in accordance with embodiments of the present disclosure.

Referring to FIGS. 3A and 3B, the semiconductor memory device may include a doped semiconductor structure DSP, a memory cell array 10, and a plurality of bit lines BL. The doped semiconductor structure DPS may face the plurality of bit lines BL in a first direction DR1. In an embodiment, the first direction DR1 may be a Z-axis direction. The doped semiconductor structure DSP may be connected to the common source line CSL, shown in FIG. 2. The memory cell array 10 may be disposed between the plurality of bit lines BL and the doped semiconductor structure DPS.

Referring to FIG. 3A, a peripheral circuit structure 40 of the semiconductor memory device may be adjacent to the doped semiconductor structure DPS. Although not shown in the drawing, a plurality of interconnections may be disposed between the peripheral circuit structure 40 and the doped semiconductor structure DPS, or a plurality of interconnections and a plurality of conductive bonding pads may be disposed between the peripheral circuit structure 40 and the doped semiconductor structure DPS.

Referring to FIG. 3B, the peripheral circuit structure 40 of the semiconductor memory device may be adjacent to the plurality of bit lines BL. Although not shown in the drawing, a plurality of interconnections may be disposed between the peripheral circuit structure 40 and the plurality of bit lines BL, or a plurality of interconnections and a plurality of conductive bonding pads may be disposed between the peripheral circuit structure 40 and the plurality of bit lines BL.

Referring to FIGS. 3A and 3B, the doped semiconductor structure DPS, the memory cell array 10, and the plurality of bit lines BL may overlap with the peripheral circuit structure 40. The memory cell array 10 may include a plurality of conductive layers that are stacked to be spaced apart from each other in the first direction DR1, a plurality of channel layers that penetrates the plurality of conductive layers, and a memory layer that separately surround each channel layer. The plurality of conductive layers may extend in a second direction DR2 and a third direction DR3 on a plane that intersects the plurality of channel layers. The plurality of bit lines BL may be spaced apart from each other in the second direction DR2 and may extend in the third direction DR3. In an embodiment, the second direction DR2 may be a Y-axis direction, and the third direction DR3 may be an X-axis direction. The plurality of conductive layers may extend on an XY plane.

A manufacturing process of the semiconductor memory device may vary. In an embodiment, the process for forming the memory cell array 10 may be performed on the peripheral circuit structure 40. In another embodiment, a first structure that includes the memory cell array 10 may be formed separately from a second structure including the peripheral circuit structure 40. The first structure and the second structure may be connected to each other through a plurality of conductive bonding pads.

FIGS. 4A, 4B, 4C, and 4D are plan views illustrating a semiconductor memory device in accordance with embodiments of the present disclosure.

Referring to FIGS. 4A to 4D, the semiconductor memory device may include a gate stack structure GST, a plurality of cell plugs CPL, and a plurality of bit lines BL.

The gate stack structure GST may be partitioned by a slit 153. The gate stack structure GST may include a plurality of conductive layers 155 that are stacked to be spaced apart from each other in a first direction DR1. Each conductive layer 155 may have a flat plate shape that extends in a second direction DR2 and a third direction DR3. The plurality of conductive layers 155 may be used as the source select line SSL, the plurality of word lines WL1 to WLn, and the first drain select line DSL1 and the second drain select line DSL2, which are shown in FIG. 2. At least one of the plurality of conductive layers 155 of the gate stack structure GST may be penetrated by a line isolation structure 173. In an embodiment, the line isolation structure 173 may be provided to isolate at least one of the plurality of conductive layers 155 into a first drain select line DSL1 and a second drain select line DSL2 as shown in FIG. 2. Some of the plurality of conductive layers 155, which are provided as a source select line SSL and a plurality of word lines WL1 to WLn, might not be penetrated by the line isolation structure 173, but may extend in the second direction DR2 and the third direction DR3 to overlap with the line isolation structure 173.

A plurality of holes 121 may be formed in the gate stack structure GST. The plurality of holes 121 may extend in the first direction DR1 to penetrate the gate stack structure GST. The plurality of cell plugs CPL may respectively correspond to the plurality of holes 121 and may be respectively disposed in the plurality of holes 121.

The plurality of cell plugs CPL may be connected to the plurality of bit lines BL via a plurality of bit line connection structures 177A, 177B, 181A, and 181B. The plurality of bit line connection structures 177A, 177B, 181A, and 181B may include a plurality of first conductive pads 177A, a plurality of second conductive pads 177B, a plurality of first conductive contacts 181A, and a plurality of second conductive contacts 181B.

Figure 4A:
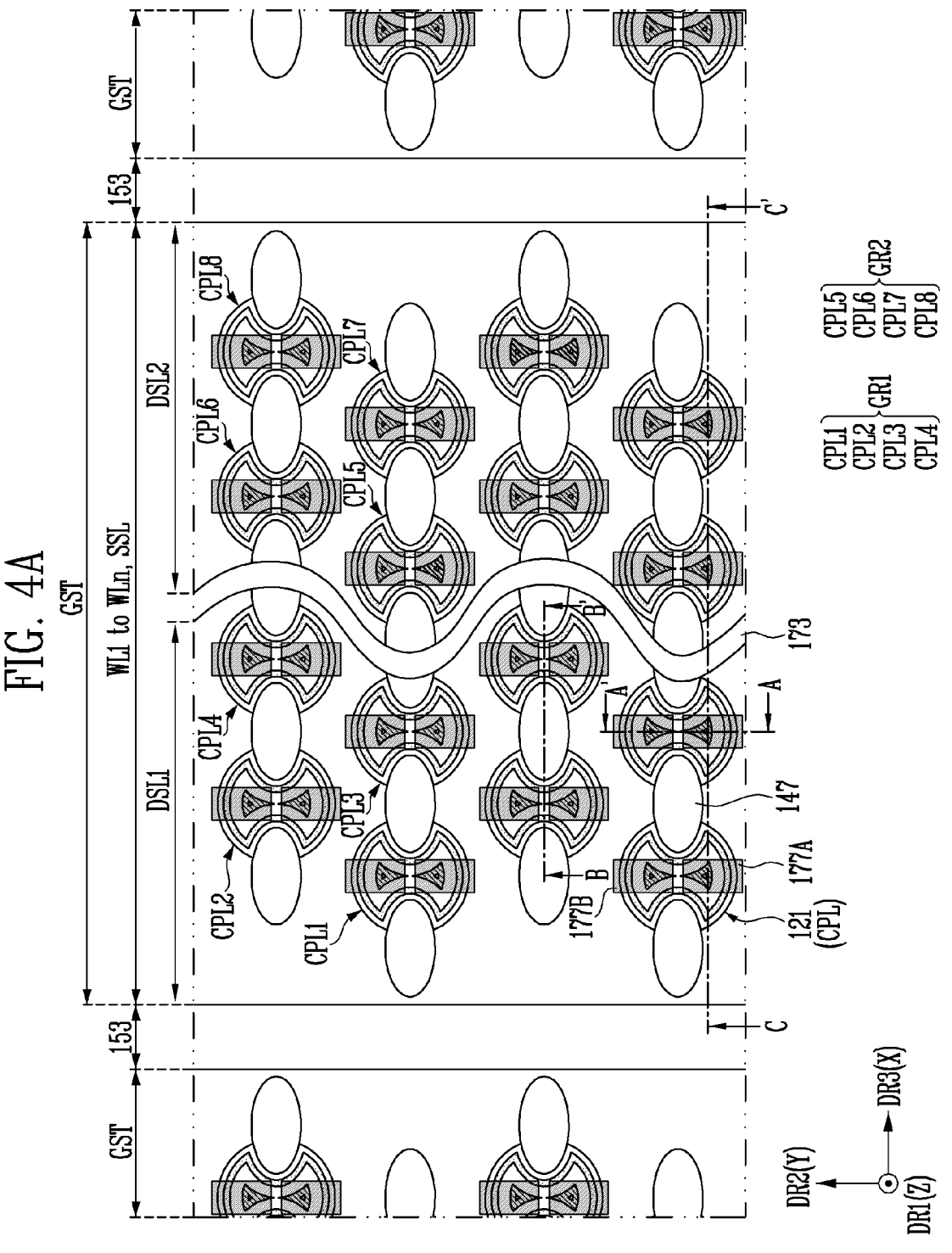
FIGS. 4A, 4B, 4C, and 4D are plan views illustrating a semiconductor memory device in accordance with embodiments of the present disclosure.

FIG. 4A illustrates a layout of the gate stack structure GST, the slit 153, the line isolation structure 173, the plurality of cell plugs CPL, the plurality of first conductive pads 177A, and the plurality of second conductive pads 177B.

Referring to FIG. 4A, the plurality of cell plugs CPL may be arranged in a zigzag pattern in the second direction DR2 and the third direction DR3. The plurality of cell plugs CPL may be divided into a first group GR1 and a second group GR2 at both sides of the line isolation structure 173. A cell plug that is included in the first group GR1 may be controlled by the first drain select line DSL1, and a cell plug that is included in the second group GR2 may be controlled by the second drain select line DSL2. Each of the plurality of word lines WL1 to WLn may continuously extend to surround the cell plug of the first group GR1 and the cell plug of the second group GR2. Accordingly, each of the plurality of word lines WL1 to WLn may control not only the cell plug that is included in the first group GR1, but also the cell plug that is included in the second group GR2.

Each of the first group GR1 and the second group GR2 may include at least one row of cell plugs. Cell plugs of each row may be arranged in a line in the second direction DR2. In an embodiment, the plurality of cell plugs CPL may include a cell plug CPL1 of a first row, a cell plug CPL2 of a second row, a cell plug CPL3 of a third row, a cell plug CPL4 of a fourth row, a cell plug CPL5 of a fifth row, a cell plug CPL6 of a sixth row, a cell plug CPL7 of a seventh row, and a cell plug CPL8 of an eighth row. The cell plugs CPL1 to CPL4 of the first to fourth rows may be included in the first group GR1 and may be controlled by the first drain select line DSL1. The cell plugs CPL5 to CPL8 of the fifth to eighth rows may be included in the second group GR2 and may be controlled by the second drain select line DSL2. Although not shown in the drawing, the plurality of cell plugs CPL may include a dummy cell plug (not shown) that overlaps with the line isolation structure 173. Each of the plurality of word lines WL1 to WLn may continuously extend to surround the cell plugs CPL1 to CPL8 of the first to eighth rows.

The cell plug CPL1 of the first row, the cell plug CPL3 of the third row, the cell plug CPL5 of the fifth row, and the cell plug CPL7 of the seventh row may be arranged in a line in the third direction DR3. The cell plug CPL2 of the second row, the cell plug CPL4 of the fourth row, the cell plug CPL6 of the sixth row, and the cell plug CPL8 of the eighth row may be arranged in a line in the third direction DR3. A column including the cell plug CPL1 of the first row, the cell plug CPL3 of the third row, the cell plug CPL5 of the fifth row, and the cell plug CPL7 of the seventh row and a column including the cell plug CPL2 of the second row, the cell plug CPL4 of the fourth row, the cell plug CPL6 of the sixth row, and the cell plug CPL8 of the eighth row may be adjacent to each other in the second direction DR2.

The semiconductor memory device may include a plurality of insulating pillars 147 that penetrates the gate stack structure GST. The plurality of insulating pillars 147 may be arranged in a zigzag pattern in the second direction DR2 and the third direction DR3. The line isolation structure 173 may overlap with some of the plurality of insulating pillars 147.

The plurality of insulating pillars 147 and the plurality of cell plugs CPL may be arranged on a plurality of columns, and an insulating pillar 147 and a cell plug CPL, which are disposed on the same column, may be alternately disposed in the third direction DR3. For example, some of the insulating pillars 147 may be alternately arranged in the third direction DR3 with the cell plug CPL1 of the first row, the cell plug CPL3 of the third row, the cell plug CPL5 of the fifth row, and the cell plug CPL7 of the seventh row, which are arranged in a line in the third direction DR3. A cell plug CPL and a hole 121 may include a region in contact with an insulating pillar 147 corresponding thereto. The cell plug CPL and the hole 121 may be concave in the region in contact with the insulating pillar 147 corresponding thereto.

Some of the plurality of insulating pillars 147 may be adjacent to the slit 153. The slit 153 may be spaced apart from an insulating pillar 147 adjacent thereto. An edge of the gate stack structure GST, which is adjacent to the slit 153, may continuously extend along the second direction DR2 while surrounding a side portions of the insulating pillar 147 adjacent to the slit 153.

The slit 153 and the line isolation structure 173 may extend in the second direction DR2. The slit 153 and the line isolation structure 173 may extend in a straight shape in the second direction DR2, extend in a wave shape in the second direction DR2, or extend in a zigzag pattern shape in the second direction DR2.

The plurality of first conductive pads 177A and the plurality of second conductive pads 177B may overlap with the plurality of cell plugs CPL. The plurality of first conductive pads 177A and the plurality of second conductive pads 177B may be divided into a plurality of pairs corresponding to the plurality of cell plugs CPL. Each pair of first and second conductive pads 177A and 177B may be connected to a surface portion of a cell plug CPL corresponding thereto. The surface portion of the cell plug CPL, which is connected to the first conductive pad 177A and the second conductive pad 177B, may face the first direction DR1. The first conductive pad 177A and the second conductive pad 177B may be spaced apart from each other in the second direction DR2 and may overlap with both ends of the cell plug CPL corresponding thereto. The first conductive pad 177A may extend in a direction that is opposite to the second direction DR2 from a surface of the first conductive pad 177A, which faces the second conductive pad 177B, and the second conductive pad 177B may extend in the second direction DR2 from a surface of the second conductive pad 177B, which faces the first conductive pad 177A.

Figure 4B:
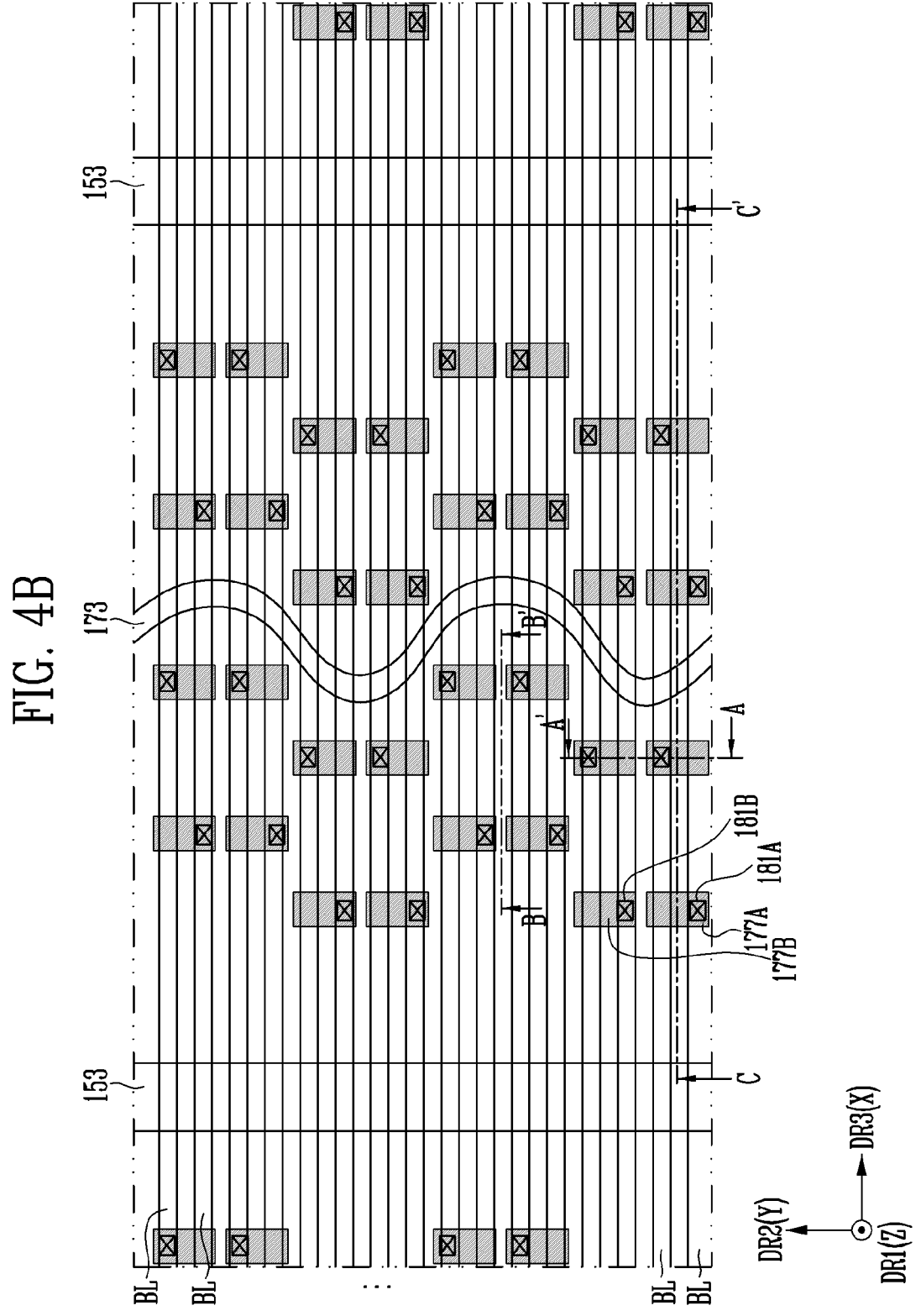

FIG. 4B illustrates a layout of the slit 153, the line isolation structure 173, the plurality of first conductive pads 177A, the plurality of second conductive pads 177B, the plurality of first conductive contacts 181A, the plurality of second conductive contacts 181B, and the plurality of bit lines BL.

Referring to FIG. 4B, the plurality of bit lines BL may extend in a direction that intersects the slit 153 and the line isolation structure 173. In an embodiment, the plurality of bit lines BL may extend in the third direction DR3. The plurality of bit lines BL may be spaced apart from each other in the second direction DR2.

The plurality of bit lines BL may overlap with the plurality of first conductive pads 177A and the plurality of second conductive pads 177B. Four bit lines BL, among the plurality of bit lines BL, consecutively disposed in the second direction DR2, may overlap with a pair of first and second conductive pads 177A and 177B that overlaps with the same cell plug. Two bit lines BL, among the above-described four bit lines BL, may overlap with the first conductive pad 177A, and the other two bit lines BL may overlap with the second conductive pad 177B.

The plurality of bit lines BL may be spaced apart from the plurality of first conductive pads 177A and the plurality of second conductive pads 177B in the first direction DR1. The plurality of bit lines BL may be connected to the plurality of first conductive pads 177A via the plurality of first conductive contacts 181A. The plurality of bit lines BL may be connected to the plurality of second conductive pads 177B via the plurality of second conductive contacts 181B.

Each first conductive contact 181A may extend in the first direction DR1 toward a bit line BL corresponding thereto from a first conductive pad 177A corresponding thereto. Each second conductive contact 181B may extend in the first direction DR1 toward a bit line BL corresponding thereto from a second conductive pad 177B corresponding thereto.

Some of the plurality of first conductive contacts 181A and the plurality of second conductive contacts 181B may be disposed at one side of the line isolation structure 173, and others of the plurality of first conductive contacts 181A and the plurality of second conductive contacts 181B may be disposed at the other side of the line isolation structure 173. Some of the plurality of first conductive contacts 181A and the plurality of second conductive contacts 181B, which are disposed at a left side of the line isolation structure 173, shown in FIG. 4B, may be variously designed to be connected one-to-one to the plurality of bit lines BL, and the others of the plurality of first conductive contacts 181A and the plurality of second conductive contacts 181B, which are disposed at a right side of the line isolation structure 173, shown in FIG. 4B, may be variously designed to be connected one-to-one to the plurality of bit lines BL.

Figure 4C:
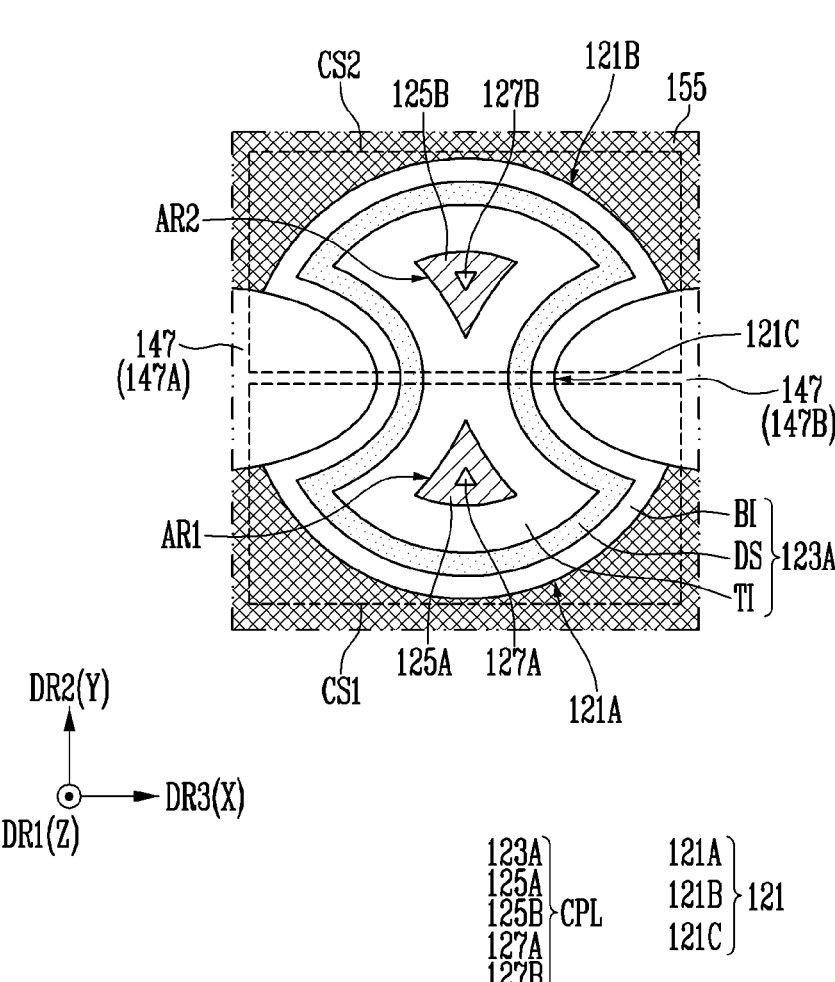

FIG. 4C is an enlarged plan view illustrating one cell plug CPL and some of the plurality of insulating pillars 147.

Referring to FIG. 4C, a conductive layer 155 may be penetrated by a plurality of insulating pillars 147 and a hole 121.

The hole 121 may include a first part 121A and a second part 121B that are adjacent to each other in the second direction DR2. The first part 121A and the second part 121B may be connected to each other. The hole 121 may have a width that becomes narrower closer to a connection point 121C that is between the first part 121A and the second part 121B. In other words, the hole 121 may have a width that becomes wider farther from the connection point 121C. In an embodiment, the hole 121 may be formed in a butterfly shape as shown in FIG. 4C.

The plurality of insulating pillars 147 may include a first insulating pillar 147A and a second insulating pillar 147B, which are disposed at both sides of the connection point 121C between the first part 121A and the second part 121B of the hole 121. The first insulating pillar 147A and the second insulating pillar 147B may be adjacent to each other in the third direction DR3 with the hole 121 interposed therebetween. The hole 121 may be concave in regions in contact with the first insulating pillar 147A and the second insulating pillar 147B. In an embodiment, a cross-sectional structure of the first insulating pillar 147A and the second insulating pillar 147B may be formed in an elliptical shape having a major axis along the third direction DR3. However, the embodiment of the present disclosure is not limited thereto, and the first insulating pillar 147A and the second insulating pillar 147B may have various cross-sectional structures having a width in the third direction DR3, which is greater than a width in the second direction DR2.

A cell plug CPL in the hole 121 may include a memory layer 123A, a first channel layer 125A, and a second channel layer 125B. The first channel layer 125A may be disposed in the first part 121A of the hole 121, and the second channel layer 125B may be disposed in the second part 121B of the hole 121. The memory layer 123A may be disposed between the first channel layer 125A and the second channel layer 125B to allow the first channel layer 125A to be spaced apart from the second channel layer 125B. The memory layer 123A may extend along a sidewall of the first part 121A of the hole 121 and a sidewall of the second part 121B of the hole 121 from between the first channel layer 125A and the second channel layer 125B. The memory layer 123A may be formed along sidewalls of the first insulating pillar 147A and the second insulating pillar 147B to have a concave shape based on a contour of the first insulating pillar 147A and the second insulating pillar 147B.

A space between the first insulating pillar 147A and the second insulating pillar 147B may be filled with the memory layer 123A, and the hole 121 may be isolated into a first region AR1 and a second region AR2 by the memory layer 123A. A distance between the first insulating pillar 147A and the second insulating pillar 147B may be formed to be twice or less than a thickness of the memory layer 123A. The thickness of the memory layer 123A may be measured from the sidewall of the first part 121A of the hole 121 to a sidewall of the first channel layer 125A or may be measured from the second part 121B of the hole 121 to a sidewall of the second channel layer 125B. The space in the hole 121, which is filled with the memory layer 123A between the first insulating pillar 147A and the second insulating pillar 147B, may correspond to a central region of a butterfly-shaped hole.

The first channel layer 125A may be disposed in the first region AR1, and the second channel layer 125B may be disposed in the second region AR2. A sidewall of each of the first channel layer 125A and the second channel layer 125B may be surrounded by the memory layer 123A.

In an embodiment, a central region of the first region AR1 may be opened by the first channel layer 125A, and a central region of the second region AR2 may be opened by the second channel layer 125B. The cell plug CPL may further include a first core insulating layer 127A and a second core insulating layer 127B. The first core insulating layer 127A may be disposed in the central region of the first region AR1, which is opened by the first channel layer 125A, and the second core insulating layer 127B may be disposed in the central region of the second region AR2, which is opened by the second channel layer 125B. However, the embodiment of the present disclosure is not limited thereto. The first region AR1 may be completely filled with the first channel layer 125A, and the second region AR2 may be completely filled with the second channel layer 125B.

The memory layer 123A may include a tunnel insulating layer TI that is interposed between each of the first channel layer 125A and the second channel layer 125B and the conductive layer 155, a data storage layer DS that is interposed between the tunnel insulating layer TI and the conductive layer 155, and a blocking insulating layer BI that is interposed between the data storage layer DS and the conductive layer 155. The data storage layer DS may be formed of a material layer capable of storing data that is changed through Fowler-Nordheim tunneling. To this end, the data storage layer DS may be formed of various materials. For example, the data storage layer DS may be formed as a charge trap layer. The charge trap layer may include a silicon nitride layer. However, the present disclosure is not limited thereto, and the data storage layer DS may include a phase change material, a nano dot, and the like. The blocking insulating layer BI may include an insulating material capable of blocking charges. The tunnel insulating layer TI may be formed as a silicon oxide layer through which charges can tunnel.

At least one of the tunnel insulating layer TI, the data storage layer DS, and the blocking insulating layer BI may extend between the first channel layer 125A and the second channel layer 125B. In an embodiment, the tunnel insulating layer TI may extend between the first channel layer 125A and the second channel layer 125B.

In accordance with the embodiment of the present disclosure described above, a first memory cell string CS1 and a second memory cell string CS2 may be defined by the cell plug CPL that is formed in one hole 121. The first memory cell string CS1 may be defined along the first channel layer 125A, and the second memory cell string CS2 may be defined along the second channel layer 125B.

Figure 4D:
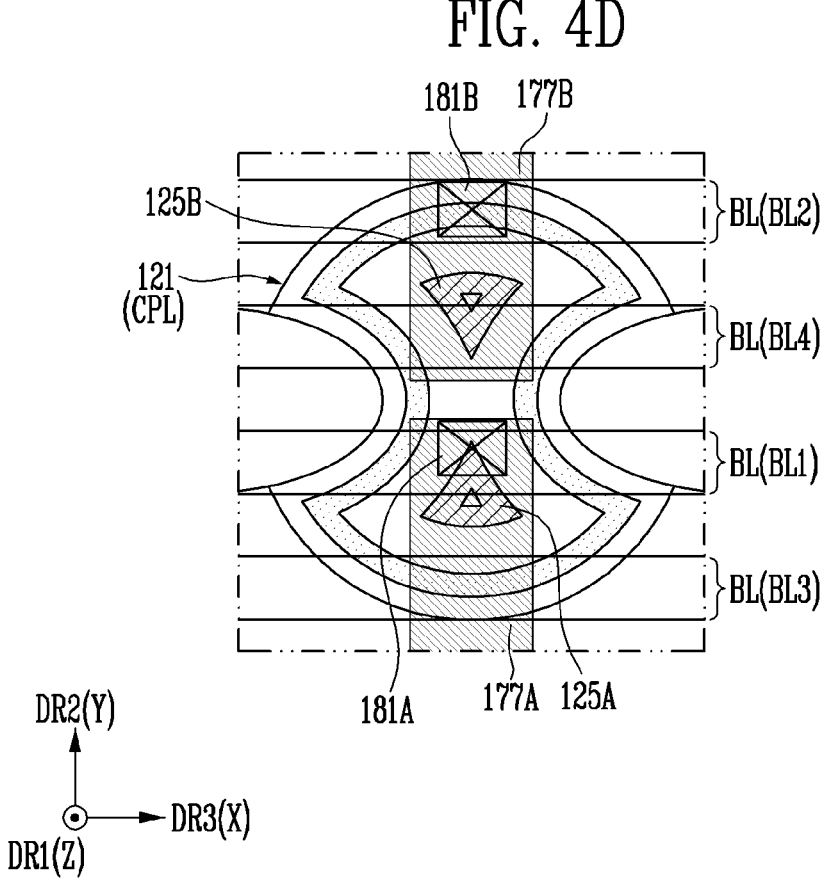

FIG. 4D is an enlarged plan view illustrating a layout of a pair of first and second conductive pads 177A and 177B that overlap with one cell plug CPL, a pair of first and second conductive contacts 181A and 181B corresponding to the pair of first and second conductive pads 177A and 177B, and four bit lines BL corresponding to the pair of first and second conductive contacts 181A and 181B.

Referring to FIG. 4D, the first conductive pad 177A may be in contact with the first channel layer 125A. The second conductive pad 177B may be in contact with the second channel layer 125B.

The four bit lines BL may be divided into first to fourth bit lines BL1 to BL4. The first bit line BL1 may be connected to the first channel layer 125A via the first conductive contact 181A and the first conductive pad 177A. The second bit line BL2 may be connected to the second channel layer 125B via the second conductive contact 181B and the second conductive pad 177B. The third bit line BL3 may overlap with the first conductive pad 177A while being adjacent to the first bit line BL1. The fourth bit line BL4 may overlap with the second conductive pad 177B while being adjacent to the second bit line BL2.

Referring to the embodiment shown in FIGS. 4A to 4D, when any one of the first drain select line DSL1 and the second drain select line DSL2 and any one of the plurality of bit lines BL are selected, any one of the first memory cell string CS1 and the second memory cell string CS2 of the cell plug CPL may be selected.

Figure 5A:
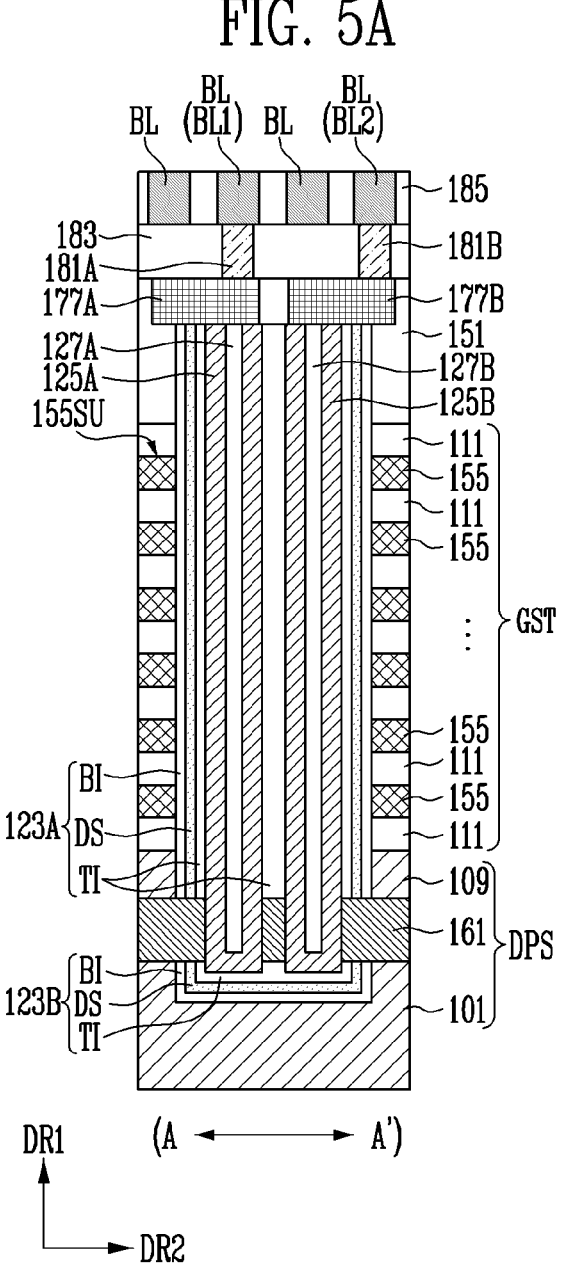
Figure 5B:
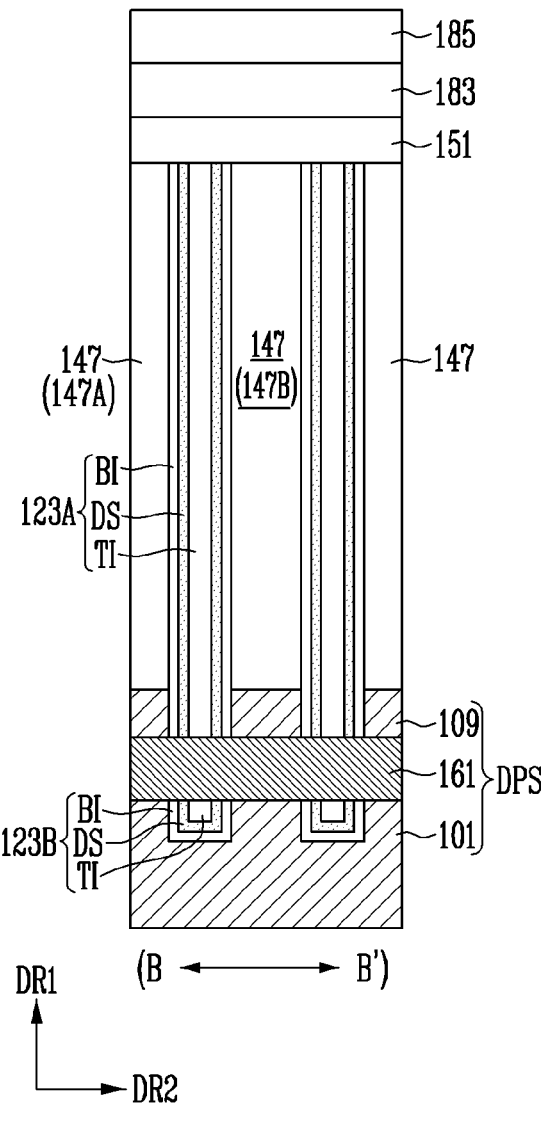
Figure 5C:
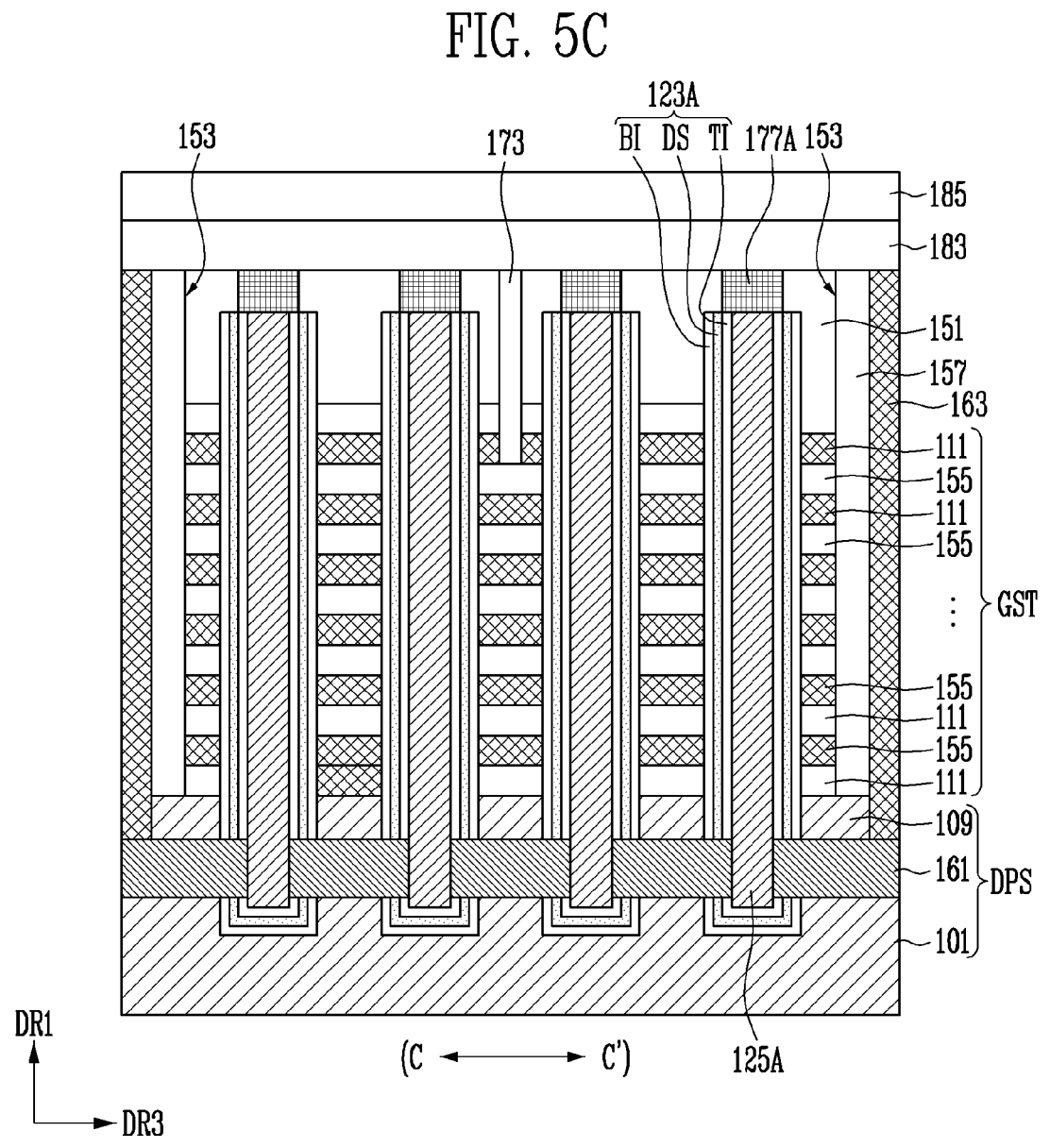

FIGS. 5A, 5B, and 5C are sectional views illustrating a semiconductor memory device in accordance with an embodiment of the present disclosure. FIG. 5A is a sectional view of the semiconductor memory device taken along line A-A', shown in FIGS. 4A and 4B, FIG. 5B is a sectional view of the semiconductor memory device taken along line B-B', shown in FIGS. 4A and 4B, and FIG. 5C is a sectional view of the semiconductor memory device taken along line C-C', shown in FIGS. 4A and 4B. Hereinafter, overlapping descriptions of components identical to those shown in FIGS. 4A to 4D will be omitted.

Referring to FIGS. 5A to 5C, a gate stack structure GST of the semiconductor memory device may include a plurality of conductive layers 155 having a surface 155SU that faces the first direction DR1. The second direction DR2 and the third direction DR3, which are described with reference to FIGS. 4A to 4D, may be defined as directions that are parallel to the surface 155SU of the plurality of conductive layers 155.

The plurality of conductive layers 155 may be stacked to be spaced apart from each other in the first direction DR1. In an embodiment, the gate stack structure GST may further include a plurality of interlayer insulating layers 111 that are alternately disposed in the first direction DR1 with the plurality of conductive layers 155. The plurality of conductive layers 155 that are adjacent to each other in the first direction DR1 may be insulated from each other by the plurality of interlayer insulating layers 111. Each conductive layer 155 may include at least one of a doped semiconductor layer, a metal layer, and a conductive metal nitride layer. The doped semiconductor layer may include a doped silicon layer. The metal layer may include tungsten, copper, molybdenum, and the like. The conductive metal nitride layer may include titanium nitride, tantalum nitride, and the like.

The gate stack structure GST may be disposed between a plurality of bit lines BL and a doped semiconductor structure DPS. The plurality of bit lines BL may include a first bit line BL1 and a second bit line BL2. The first bit line BL1 and the second bit line BL2 may overlap with a pair of first and second conductive pads 177A and 177B corresponding thereto and may be respectively connected to a first channel layer 125A and a second channel layer 125B. The doped semiconductor structure DPS may be connected to not only the first channel layer 125A but also the second channel layer 125B.

At least one insulating layer may be disposed between the gate stack structure GST and the plurality of bit lines BL. In an embodiment, a first insulating layer 151 and a second insulating layer 183 may be disposed between the gate stack structure GST and the plurality of bit lines BL.

The plurality of bit lines BL may penetrate a third insulating layer 185 on the second insulating layer 183.

At least one conductive layer that is adjacent to the plurality of bit lines BL, among the plurality of conductive layers 155, may be penetrated by a line isolation structure 173. The line isolation structure 173 may be formed of an insulating material and may extend in the first direction DR1 to penetrate the first insulating layer 151. A sidewall insulating layer 157 may be formed on a sidewall of a slit 153 that forms a common plane with the gate stack structure GST. A source contact structure 163 may be disposed in the slit 153. The source contact structure 163 may be provided to electrically connect the doped semiconductor structure DPS to the common source line CSL, shown in FIGS. 1 and 2. The source contact structure 163 may be insulated from the plurality of conductive layers 155 of the gate stack structure GST by the sidewall insulating layer 157.

A portion of the first insulating layer 151, which overlaps with the first channel layer 125A, may be penetrated by the first conductive pad 177A, and a portion of the first insulating layer 151, which overlaps with the second channel layer 125B, may be penetrated by the second conductive pad 177B. A portion of the second insulating layer 183, which overlaps with the first conductive pad 177A, may be penetrated by a first conductive contact 181A, and a portion of the second insulating layer 183, which overlaps with the second conductive pad 177B, may be penetrated by a second conductive contact 181B.

The doped semiconductor structure DPS may include a lower doped semiconductor layer 101, a channel contact layer 161, and an etch stop layer 109. The channel contact layer 161 may be disposed between the lower doped semiconductor layer 101 and the gate stack structure GST. The etch stop layer 109 may be disposed between the channel contact layer 161 and the gate stack structure GST. The etch stop layer 109 may be omitted in some cases.

The channel contact layer 161 may be formed as a doped semiconductor layer. Each of the lower doped semiconductor layer 101 and the channel contact layer 161 may include at least one of an n-type impurity and a p-type impurity. The source contact structure 163 may be in contact with the channel contact layer 161 to extend in the first direction DR1. The source contact structure 163 may be formed of the same material as the channel contact layer 161 or may be formed of various conductive materials that include a metal.

The etch stop layer 109 may be formed of a material that is selected by considering an etch selectivity during an etching process for forming the slit 153. In an embodiment, the etch stop layer 109 may include a silicon layer.

Each insulating pillar 147 may penetrate the gate stack structure GST. The insulating pillar 147 may be arranged on the doped semiconductor structure DPS. The first channel layer 125A and the second channel layer 125B may protrude farther into the doped semiconductor structure DPS than the insulating pillar 147. Accordingly, the first channel layer 125A and the second channel layer 125B may be formed to have a length that is longer than a length of the insulating pillar 147 in the first direction DR1.

A memory layer 123A, the first channel layer 125A, the second channel layer 125B, a first core insulating layer 127A, and a second core insulating layer 127B may extend to penetrate not only the gate stack structure GST but also the etch stop layer 109. The memory layer 123A may be disposed on the channel contact layer 161. The first channel layer 125A, the second channel layer 125B, a first core insulating layer 127A, and a second core insulating layer 127B may extend into the lower doped semiconductor layer 101 while penetrating the gate stack structure GST and the etch stop layer 109.

The channel contact layer 161 may be in contact with a sidewall of each of the first channel layer 125A and the second channel layer 125B and may surround the sidewall of each of the first channel layer 125A and the second channel layer 125B. The channel contact layer 161 may extend along the second direction DR2 and the third direction DR3. Each of the first channel layer 125A and the second channel layer 125B may be used as a channel region of a memory cell string corresponding thereto. To this end, the first channel layer 125A and the second channel layer 125B may be formed of a semiconductor material including silicon, germanium, and the like.

A lower memory layer 123B may be interposed between each of the first channel layer 125A and the second channel layer 125B and the lower doped semiconductor layer 101. Like the memory layer 123A, the lower memory layer 123B may include a tunnel insulating layer TI, a data storage layer DS, and a blocking insulating layer BI. The memory layer 123A and the lower memory layer 123B may be spaced apart from each other by the channel contact layer 161 interposed therebetween.

At least one of the tunnel insulating layer TI, the data storage layer DS, and the blocking insulating layer BI of each of the memory layer 123A and the lower memory layer 123B may extend between the first channel layer 125A and the second channel layer 125B. In an embodiment, the tunnel insulating layer TI of each of the memory layer 123A and the lower memory layer 123B may fill a space between the first channel layer 125A and the second channel layer 125B. Accordingly, the first channel layer 125A of the first memory cell string CS1 and the second channel layer 125B of the second memory cell string CS2, which are shown in FIG. 4C, may be isolated from each other.

Regions in which the first channel layer 125A and the second channel layer 125B are disposed may be isolated from each other by at least one of the tunnel insulating layer TI, the data storage layer DS, and the blocking insulating layer BI in a process of manufacturing the semiconductor memory device. To this end, the shape of the hole, shown in FIGS. 4A to 4D, may be controlled such that the hole 121 becomes narrower in the third direction DR3 as the point of measurement is closer to the space between the first channel layer 125A and the second channel layer 125B in a plan view.

Although not shown in FIGS. 5A to 5C, a peripheral circuit structure of the semiconductor memory device may be disposed to be adjacent to the doped semiconductor structure DPS as described with reference to FIG. 3A or may be disposed adjacent to the plurality of bit lines BL as described with reference to FIG. 3B.

Figure 6A:
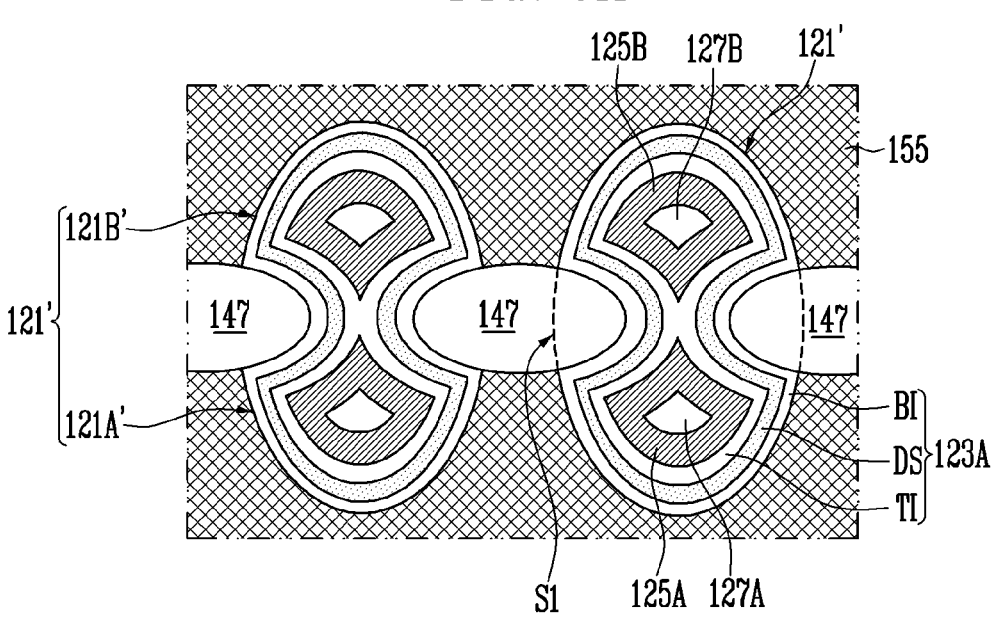
FIGS. 6A, 6B, and 6C are plan views illustrating a semiconductor memory device in accordance with embodiments of the present disclosure.
Figure 6B:
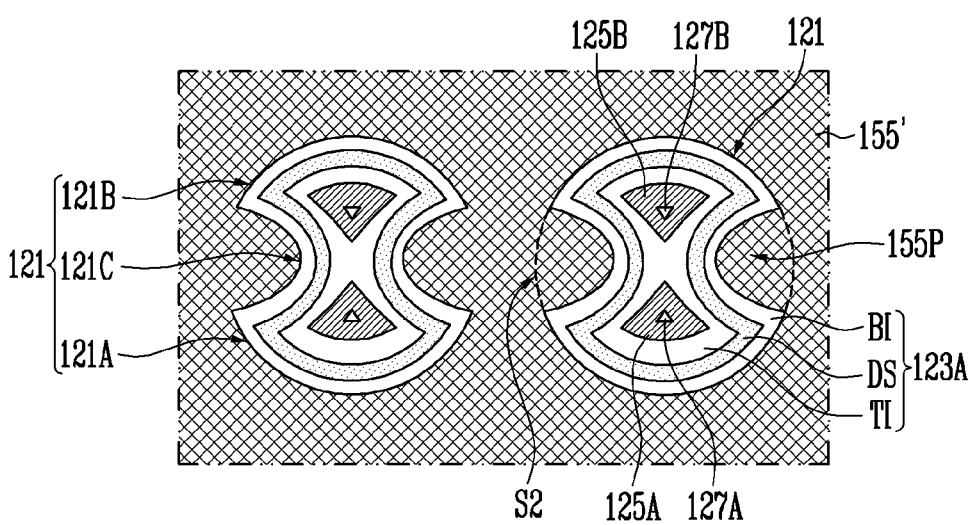
Figure 6C:
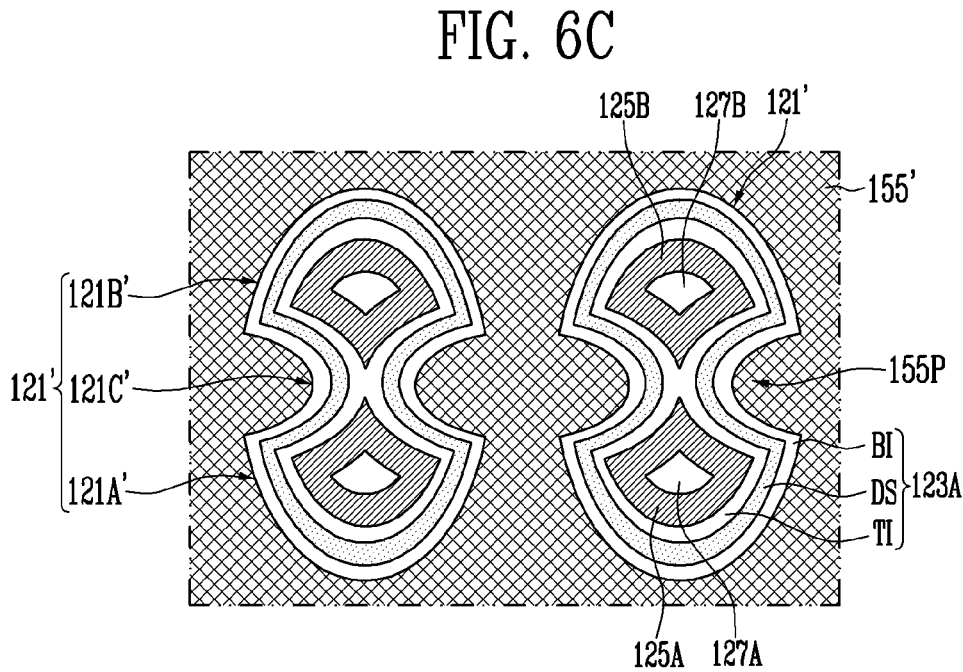

FIGS. 6A, 6B, and 6C are plan views illustrating a semiconductor memory device in accordance with embodiments of the present disclosure.

Referring to FIG. 6A, a hole 121' may include a first part 121A' and a second part 121B' as described with reference to FIGS. 4A to 4D and may be concave in a region in contact with the insulating pillar 147. A conductive layer 155 may surround the insulating pillar 147 and the memory layer 123A.

An edge of the hole 121' may overlap with a hypothetical ellipse S1. For example, an edge that is defined along the first part 121A' of the hole 121' may overlap with one edge of the hypothetical ellipse S1, and an edge that is defined along the second part 121B' of the hole 121' may overlap with the other edge of the hypothetical ellipse S1.

Referring to FIG. 6B, a hole 121 may include a first part 121A and a second part 121B as described with reference to FIGS. 4A to 4D. A conductive layer 155' may include a protrusion part 155P that protrudes toward a connection point 121C between the first part 121A and the second part 121B of the hole 121. The hole 121 may be concave in a region in contact with the protrusion part 155P of the conductive layer 155'. A memory layer 123A may be formed along the protrusion part 155P of the conductive layer 155' to have a concave shape based on a contour of the protrusion part 155P.

An edge of the hole 121 may overlap with a hypothetical circular shape S2. For example, an edge that is defined along the first part 121A of the hole 121 may overlap with one edge of the hypothetical circular shape S2, and an edge that is defined along the second part 121B of the hole 121 may overlap with the other edge of the hypothetical circular shape S2.

Referring to FIG. 6C, a hole 121' may include a first part 121A' and a second part 121B', which overlap with an edge of a hypothetical ellipse as shown in FIG. 6A. A conductive layer 155' may include a protrusion part 155P that protrudes toward a connection point 121C' between the first part 121A' and the second part 121B' as shown in FIG. 6B.

As described with reference to FIGS. 6A to 6C, the holes 121/121' may be formed in various shapes. For example, the holes 121/121' may be formed in a butterfly shape having a concave part in a region in contact with the insulating pillar 147 or may be formed in a butterfly shape having a concave part in a region in contact with the protrusion part 155P of the conductive layer 155'.

Referring to FIGS. 6A to 6C, a central region of each of the holes 121/121', which correspond to the concave part, may be filled with at least one of the tunnel insulating layer TI, the data storage layer DS, and the blocking insulating layer BI of the memory layer 123A. Accordingly, the first channel layer 125A and the second channel layer 125B in each of the holes 121/121' may be spaced part from each other with the memory layer 123A interposed therebetween. Peripheral regions of the holes 121/121', between the conductive layer 155'/155 and each of the first channel layer 125A and the second channel layer 125B, may be filled with at least one of the tunnel insulating layer TI, the data storage layer DS, and the blocking insulating layer BI of the memory layer 123A. The peripheral regions may include regions other than the central regions of each of the holes 121/121', shown in FIGS. 6A to 6C. Central regions of the first channel layer 125A and the second channel layer 125B may be respectively filled with the first core insulating layer 127A and the second core insulating layer 127B as described with reference to FIG. 4C.

Figure 7:
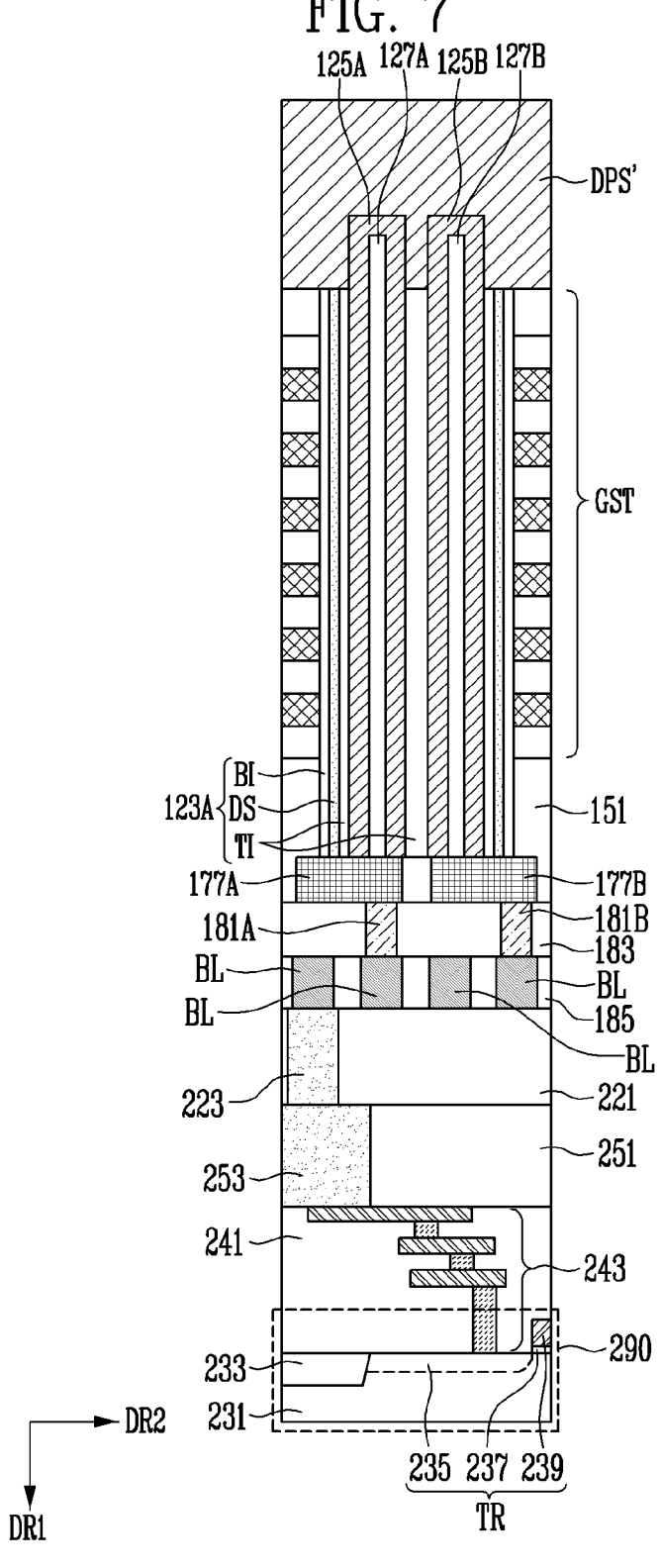
FIG. 7 is a sectional view illustrating a semiconductor memory device in accordance with an embodiment of the present disclosure.

FIG. 7 is a sectional view illustrating a semiconductor memory device in accordance with an embodiment of the present disclosure. Hereinafter, overlapping descriptions of components identical to those shown in FIGS. 4A to 4D and 5A to 5C will be omitted.

Referring to FIG. 7, the semiconductor memory device may include a gate stack structure GST, a memory layer 123A, a first channel layer 125A, a second channel layer 125B, a first core insulating layer 127A, a second core insulating layer 127B, a first insulating layer 151, a first conductive pad 177A, a second conductive pad 177B, a second insulating layer 183, a first conductive contact 181A, a second conductive contact 181B, a third insulating layer 185, and a plurality of bit lines BL as described with reference to FIGS. 4A to 4D and 5A to 5C. These may overlap with a peripheral circuit structure 290 of the semiconductor memory device. The peripheral circuit structure 290 may include a transistor TR.

The transistor TR may be disposed in an active region of a semiconductor substrate 231. The semiconductor substrate 231 may be a silicon substrate, a silicon-germanium substrate, a germanium substrate, a single crystalline silicon substrate, or a substrate including a single crystalline epitaxial layer. The active region of the semiconductor substrate 231 may be partitioned by an isolation layer 233.

The transistor TR may include a gate insulating layer 237, a gate electrode 239, and junctions 235. The gate insulating layer 237 and the gate electrode 239 may be stacked on the active region of the semiconductor substrate 231. The junctions 235 may be formed in the active region of the semiconductor substrate 231 at both sides of the gate electrode 239 and may be defined as regions into which at least one of an n-type impurity and a p-type impurity is implanted. The junctions 235 may be provided as a source region and a drain region of a transistor TR corresponding thereto.

The peripheral circuit structure 290 may be covered by a lower insulating structure 241. The lower insulating structure 241 may include two or more insulating layers that are stacked on the semiconductor substrate 231.

The transistor TR may be connected to an interconnection 243. The interconnection 243 may include two or more sub-conductive layers. The interconnection 243 may be disposed in the lower insulating structure 241.

A bonding structure may be formed between the lower insulating structure 241 and the third insulating layer 185. The bonding structure may include a first bonding insulating layer 221, a second bonding insulating layer 251, a first conductive bonding pad 223, and a second conductive bonding pad 253. The first bonding insulating layer 221 and the second bonding insulating layer 251 may be disposed between the lower insulating structure 241 and the third insulating layer 185.

The first bonding insulating layer 221 may be adjacent to the plurality of bit lines BL, and the second bonding insulating layer 251 may be adjacent to the interconnection 243. The first bonding insulating layer 221 and the second bonding insulating layer 251 may include silicon oxide, silicon oxynitride, silicon carbonitride, and the like.

The first conductive bonding pad 223 may be disposed in the first bonding insulating layer 221. The second conductive bonding pad 253 may be disposed in the second bonding insulating layer 251. The first conductive bonding pad 223 and the second conductive bonding pad 253 may include a metal including copper, a copper alloy, and the like.

The bonding structure may be provided by bonding the first bonding insulating layer 221 to the second bonding insulating layer 251 and bonding the first conductive bonding pad 223 to the second conductive bonding pad 253. A first structure including the gate stack structure GST, the first channel layer 125A, the second channel layer 125B, and the memory layer 123A may be structurally connected to a second structure including the peripheral circuit structure 290. In an embodiment, the first conductive bonding pad 223 and the second conductive bonding pad 253 may be used to electrically connect the peripheral circuit structure 290 and the plurality of bit lines BL to each other. More specifically, the first conductive bonding pad 223 may be connected to a bit line BL corresponding thereto, and the second conductive bonding pad 253 may be connected to an interconnection 243 corresponding thereto. The bit line BL may be connected to a transistor TR corresponding thereto via the first conductive bonding pad 223, the second conductive bonding pad 253, and the interconnection 243.

A doped semiconductor structure DPS' of the semiconductor memory device may be disposed over a surface of the gate stack structure, which faces the opposite direction of the first direction DR1. The doped semiconductor structure DPS' may be formed as a doped semiconductor layer including at least one of an n-type impurity and a p-type impurity.

The first channel layer 125A and the second channel layer 125B may protrude farther into the doped semiconductor structure DPS' than a tunnel insulating layer TI, a data storage layer DS, and a blocking insulating layer BI of the memory layer 123A. The doped semiconductor structure DPS' may be in contact with end portions of the first channel layer 125A and the second channel layer 125B, which are disposed in the doped semiconductor structure DPS'.

FIGS. 8A, 8B, 9A, 9B, 10A, 10B, 11A, 11B, 12A, 12B, 13, and 14 are views illustrating a manufacturing method of a semiconductor memory device in accordance with embodiments of the present disclosure.

Figure 8A:
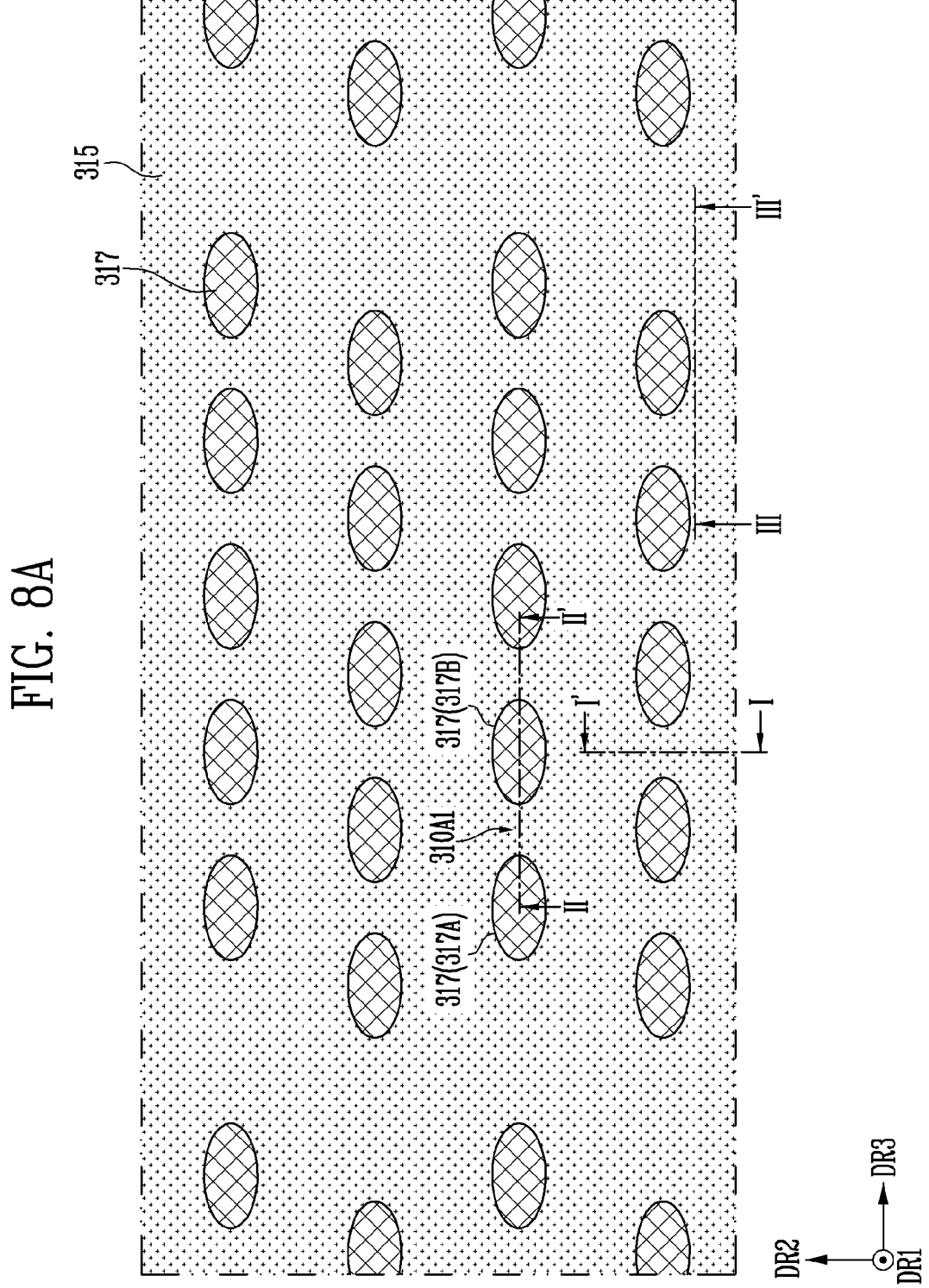
FIGS. 8A, 8B, 9A, 9B, 10A, 10B, 11A, 11B, 12A, 12B, 13, and 14 are views illustrating a manufacturing method of a semiconductor memory device in accordance with embodiments of the present disclosure.
Figure 8B:
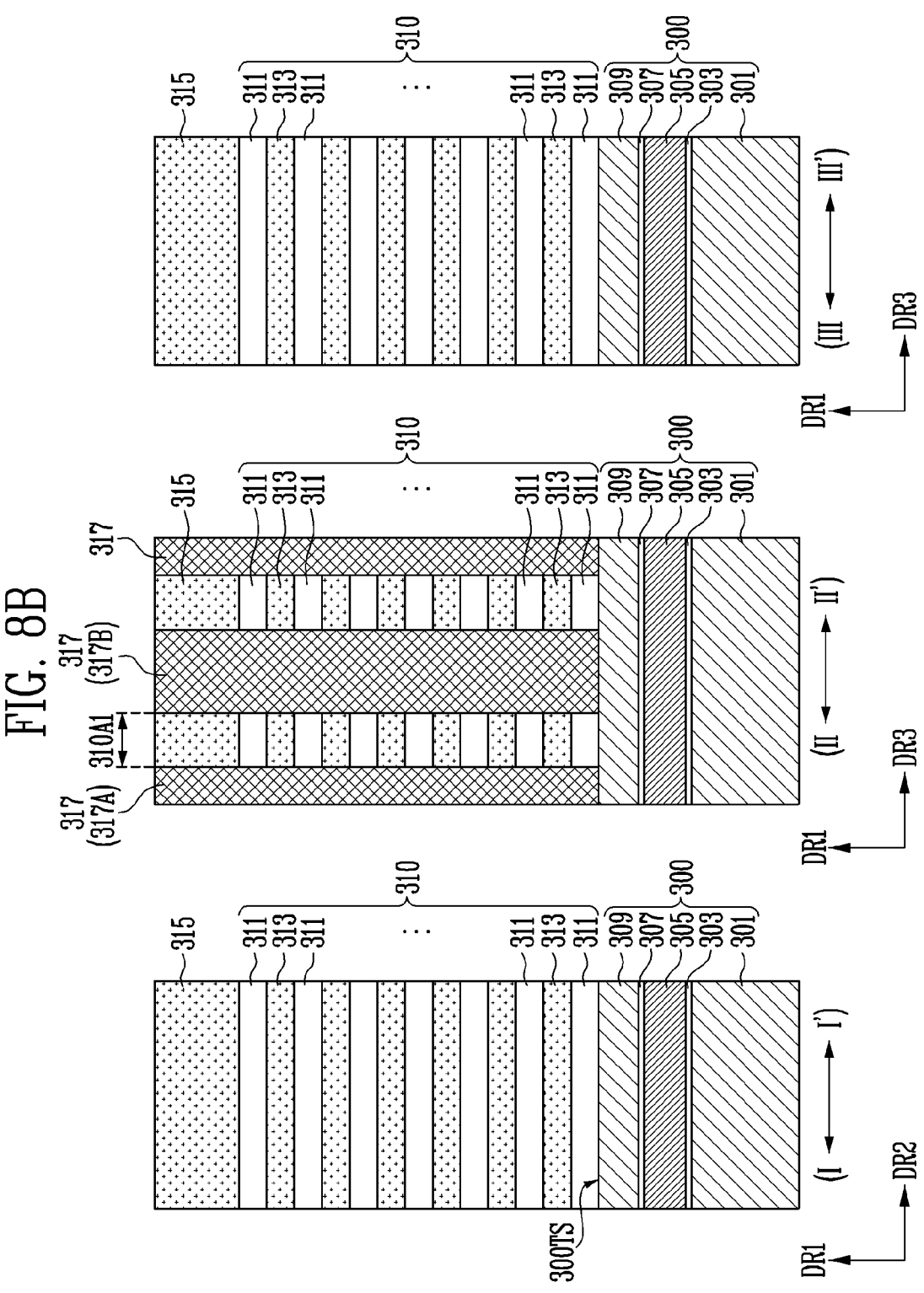

FIGS. 8A and 8B are views illustrating a process of forming a plurality of etch stop patterns. FIG. 8B illustrates sectional views taken along lines I-I', II-II', and III-III' shown in a plan view shown in FIG. 8A.

Referring to FIGS. 8A and 8B, a plurality of etch stop patterns 317 may be formed to penetrate a stack structure 310. The stack structure 310 may be formed over a lower structure 300. For example, a top surface 300TS of the lower structure 300 may face a first direction DR1, and the stack structure 310 may be disposed over the top surface 300TS of the lower structure 300.

The lower structure 300 may be provided as a preliminary doped semiconductor structure. Although not shown in the drawings, the preliminary doped semiconductor structure may be formed over a peripheral circuit structure. Hereinafter, the manufacturing method of the present disclosure is described based on an embodiment in which the lower structure 300 is provided as the preliminary doped semiconductor structure, but the present disclosure is not limited thereto. For example, the lower structure 300 may be a sacrificial substrate or may include a sacrificial substrate and an etch stop layer on the sacrificial substrate. The sacrificial substrate and the etch stop layer may be applied to a process of forming the semiconductor memory device, shown in FIG. 7.

The lower structure 300 as the preliminary doped semiconductor structure may include a lower doped semiconductor layer 301, a first protective layer 303 on the lower doped semiconductor layer 301, and a sacrificial layer 305 on the first protective layer 303. The lower structure 300 may further include an etch stop layer 309 on the sacrificial layer 305 and a second protective layer 307 between the sacrificial layer 305 and the etch stop layer 309. The first protective layer 303 and the second protective layer 307 may be formed of a material having an etch selectivity with respect to the sacrificial layer 305. In an embodiment, the sacrificial layer 305 may be formed as an undoped silicon layer, and each of the first protective layer 303 and the second protective layer 307 may be formed as an oxide layer. The etch stop layer 309 may be formed of a material having an etch selectivity with respect to the stack structure 310. In an embodiment, the etch stop layer 309 may be formed as a semiconductor layer including silicon and the like.

The stack structure 310 may include a plurality of first material layers 311 and a plurality of second material layers 313, which are alternately stacked over the lower structure 300. The second material layer 313 may be formed of a material different from a material of the first material layer 311. In an embodiment, the first material layer 311 may be provided as an interlayer insulating layer, and the second material layer 313 may be provided as a conductive layer. The first material layer 311 may include an insulating material including silicon oxide and the like, and the second material layer 313 may include at least one of a doped semiconductor layer, a metal layer, and a conductive metal nitride layer. In another embodiment, the first material layer 311 may be provided as an interlayer insulating layer, and the second material layer 313 may be formed of a sacrificial material having an etch selectivity with respect to the first material layer 311. The first material layer 311 may be formed of silicon oxide, and the second material layer 313 may be formed of silicon nitride.

The plurality of etch stop patterns 317 may penetrate the stack structure 310 and a mask layer 315 on the stack structure 310. The plurality of etch stop patterns 317 may be formed of a material having an etch selectivity with respect to the first material layer 311 and the second material layer 313 of the stack structure 310. In an embodiment, when the first material layer 311 is formed of silicon oxide and the second material layer 313 is formed of silicon nitride, the etch stop pattern 317 may include at least one of a metal layer and a conductive metal nitride. The metal layer may include tungsten, and the conductive metal nitride may include titanium nitride.

A second direction DR2 and a third direction DR3, which are shown in the drawings, may be directions in which axes intersect each other in a plan view, on a plane that is parallel to the top surface 300TS of the lower structure 300. The plurality of etch stop patterns 317 may be arranged to be spaced apart from each other in the second direction DR2 and the third direction DR3 and may be arranged in a zigzag pattern. The plurality of etch stop patterns 317 may constitute a plurality of columns and a plurality of rows. Each column may include a first etch stop pattern 317A and a second etch stop pattern 317B, which are arranged in the third direction DR3. Hereinafter, a partial region of the stack structure 310 between the first etch stop pattern 317A and the second etch stop pattern 317B is defined as a channel isolation region 310A1.

Figure 9A:
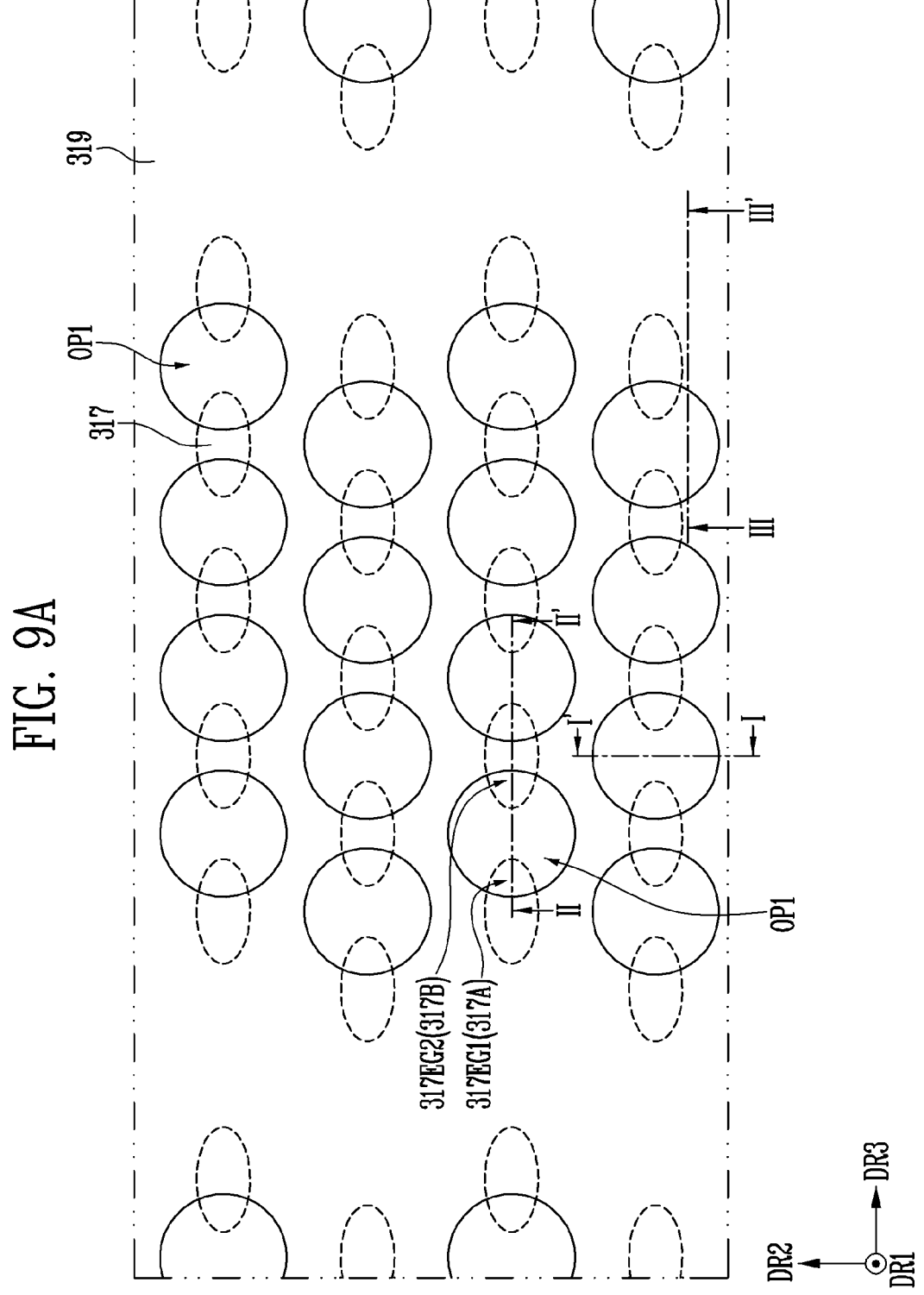
Figure 9B:
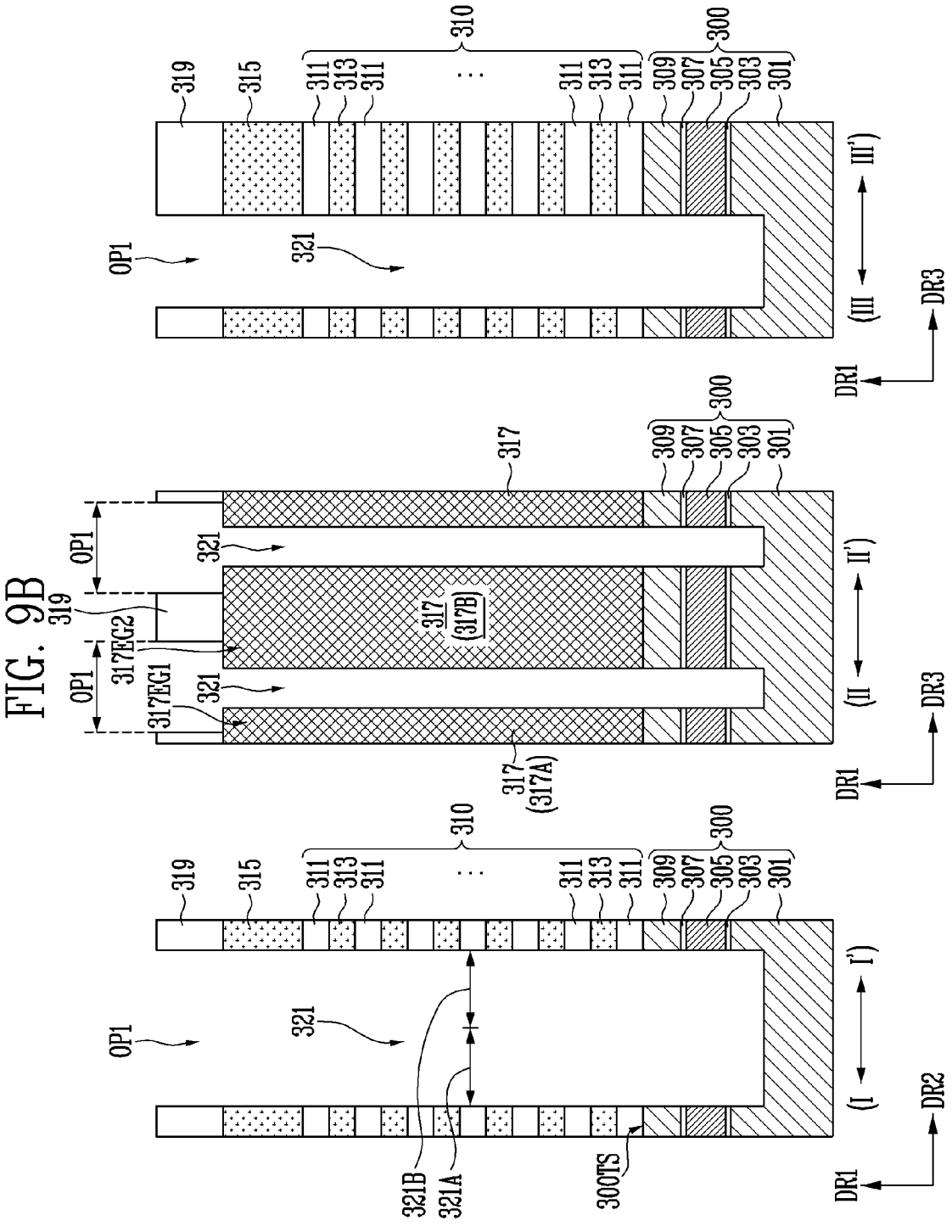

FIGS. 9A and 9B are views illustrating a process of forming a plurality of holes. FIG. 9B illustrates sectional views taken along lines I-I', II-II', and III-III' shown in a plan view shown in FIG. 9A.

Referring to FIGS. 9A and 9B, a first mask pattern 319 may be formed over the stack structure 310 through a photolithography process. The first mask pattern 319 may include a plurality of first openings OP1. The channel isolation region 310A of the stack structure 310, shown in FIGS. 8A and 8B, may be exposed by a first opening OP1 corresponding thereto. On a plane parallel to the top surface 300TS of the lower structure 300, the first opening OP1 may be formed to be wider than the channel isolation region 310A, shown in FIGS. 8A and 8B. Accordingly, an end portion 317EG1 of the first etch stop pattern 317A and an end portion 317EG2 of the second etch stop pattern 317B, which are adjacent to the channel isolation region 310A1, shown in FIGS. 8A and 8B, may be exposed through the first opening OP1. In addition, a partial region of the stack structure 310, which is adjacent to the end portion 317EG1 of the first etch stop pattern 317A and the end portion 317EG2 of the second etch stop pattern 317B, and a partial region of the stack structure 310, which is adjacent to the channel isolation region 310A1, shown in FIGS. 8A and 8B, may be exposed through the first opening OP1. The shape of the first opening OP1 may vary. In embodiments, the first opening OP1 may have a shape corresponding to the hypothetical ellipse S1, shown in FIG. 6A, or may have a shape corresponding to the hypothetical circular shape S2, shown in FIG. 6B.

Subsequently, partial regions of the stack structure 310 that correspond to the plurality of first openings OP1 may be etched. Accordingly, a plurality of holes 321 may be formed in the stack structure 310. The first protective layer 303, the sacrificial layer 305, the second protective layer 307, and the etch stop layer 309 of the lower structure 300 may be etched through the plurality of first openings OP1 such that each hole 321 may extend into the lower doped semiconductor layer 301. A portion of the lower doped semiconductor layer 301 may be etched such that the hole 321 extends into the lower doped semiconductor layer 301. While the plurality of holes 321 are formed, the plurality of etch stop patterns 317 in addition to the first mask pattern 319 may serve as an etch barrier. Accordingly, from a planar viewpoint, each hole 321 may be concave in regions in contact with the first etch stop pattern 317A and the second etch stop pattern 317B.

In accordance with the embodiment of the present disclosure described above, as described with reference to FIG. 4C, the hole 321 may include a first part 321A and a second part 321B, which are connected to each other while being adjacent to each other in the second direction DR2, the widths of the first part 321A and the second part 321B becoming narrower closer to a connection point. In an embodiment, in a plan view, on a plane parallel to the top surface 300TS of the lower structure 300, the hole 321 may be formed in a butterfly shape. The first mask pattern 319 may be removed after the hole 321 is formed.

FIGS. 10A and 10B and 11A and 11B are views illustrating a process of replacing the plurality of etch stop patterns with a plurality of insulating pillars and an isolation process of a channel layer.

Figure 10A:
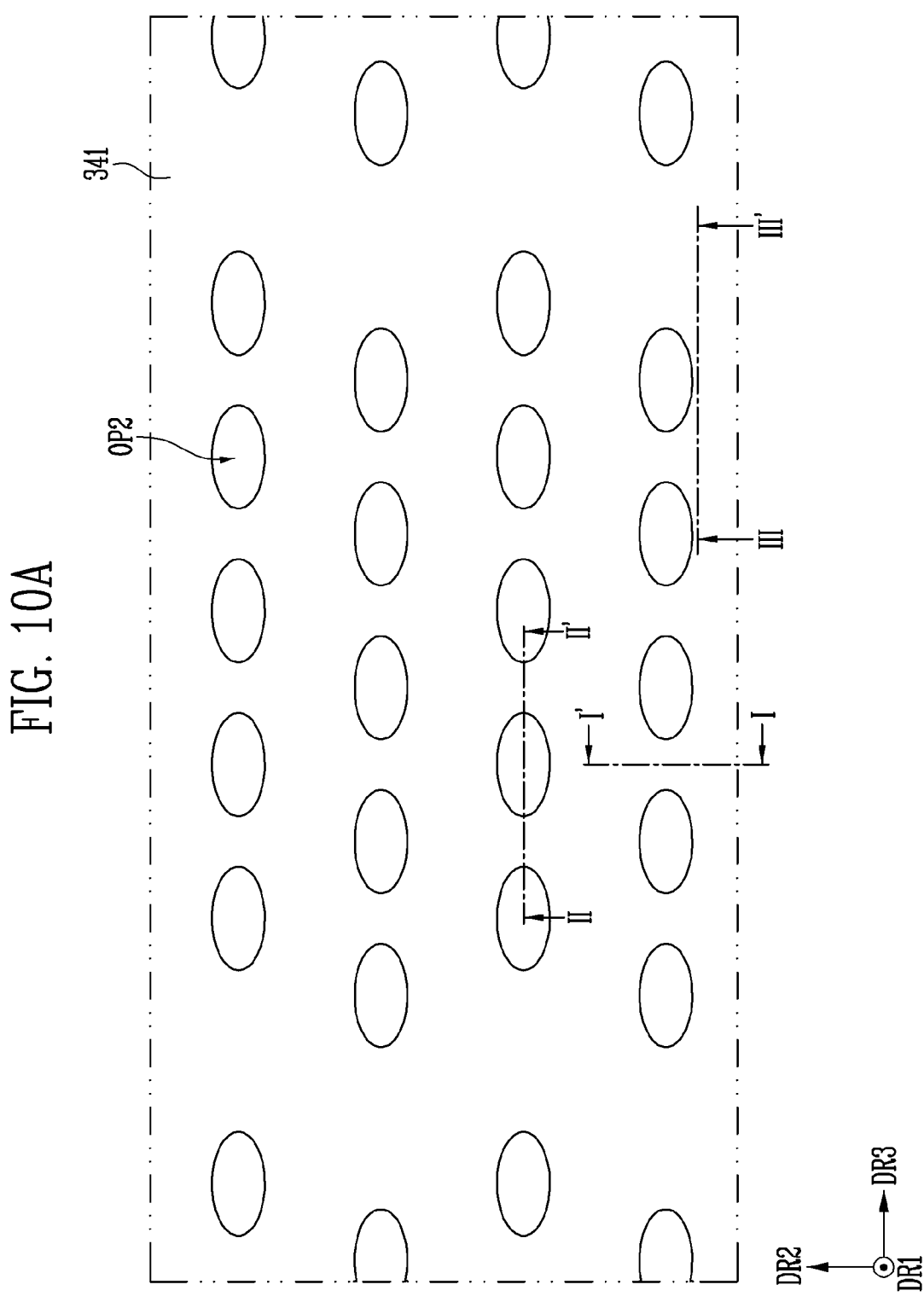
Figure 10B:
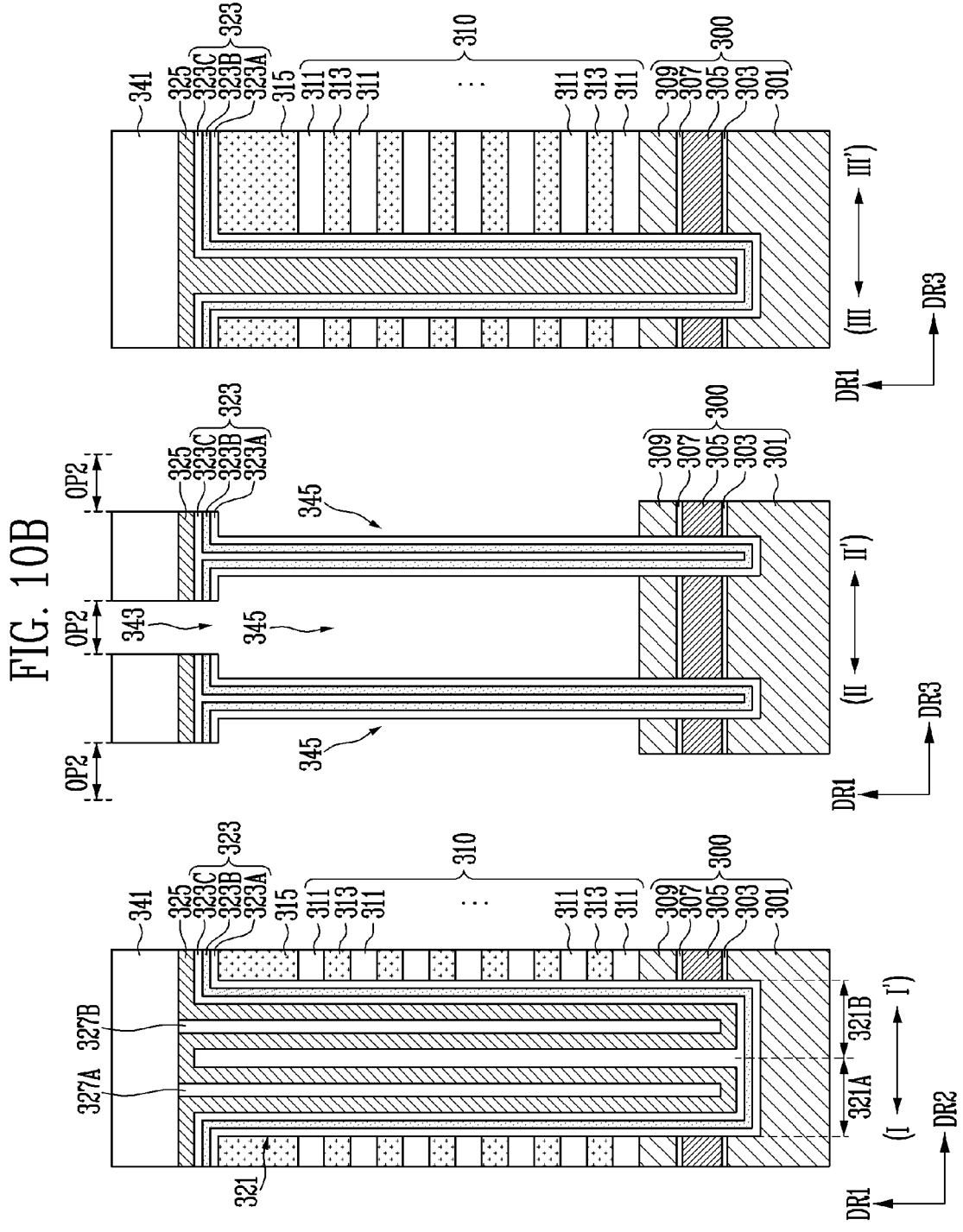

FIGS. 10A and 10B are plan and sectional views illustrating a subsequent process performed after the process shown in FIGS. 9A and 9B. FIG. 10B illustrates sectional views taken along lines I-I', II-II', and III-III' shown in a plan view shown in FIG. 10A.

Referring to FIGS. 10A and 10B, a preliminary memory layer 323 and a preliminary channel layer 325 may be formed in each of the plurality of holes 321, shown in FIG. 9B. The preliminary memory layer 323 may extend along a bottom surface and a sidewall of each of the plurality of holes 321. The preliminary memory layer 323 may include a blocking insulating layer 323A, a data storage layer 323B, and a tunnel insulating layer 323C as described with reference to FIG. 4C. The preliminary memory layer 323 may fill a partial region of a hole 321 between the first etch stop pattern 317A and the second etch stop pattern 317B, which are shown in FIG. 9B. Accordingly, as described with reference to FIG. 4C, the first part 321A and the second part 321B of the hole 321 may be isolated from each other by the preliminary memory layer 323.

Subsequently, the preliminary channel layer 325 may be formed on the preliminary memory layer 323. The preliminary channel layer 325 may be formed as a semiconductor layer including silicon, germanium, and the like. When a portion region of the hole 321 is opened by the preliminary channel layer 325, a first core insulating layer 327A and a second core insulating layer 327B may be respectively formed in the first part 321A and the second part 321B of the hole 321 that are opened by the preliminary channel layer 325.

Subsequently, a second mask pattern 341 may be formed over the preliminary channel layer 325 through a photolithography process. The second mask pattern 341 may include a plurality of second openings OP2. The plurality of second openings OP2 may respectively correspond to the plurality of etch stop patterns 317 shown in FIG. 9B.

Subsequently, a portion of the preliminary channel layer 325 and a portion of the preliminary memory layer 323, which correspond to each second opening OP2, may be etched, thereby exposing the etch stop pattern 317, shown in FIG. 9B. Subsequently, the plurality of etch stop patterns 317, shown in FIG. 9B, may be removed so that a plurality of auxiliary holes 345 are formed to expose the lower structure 300.

Figure 11A:
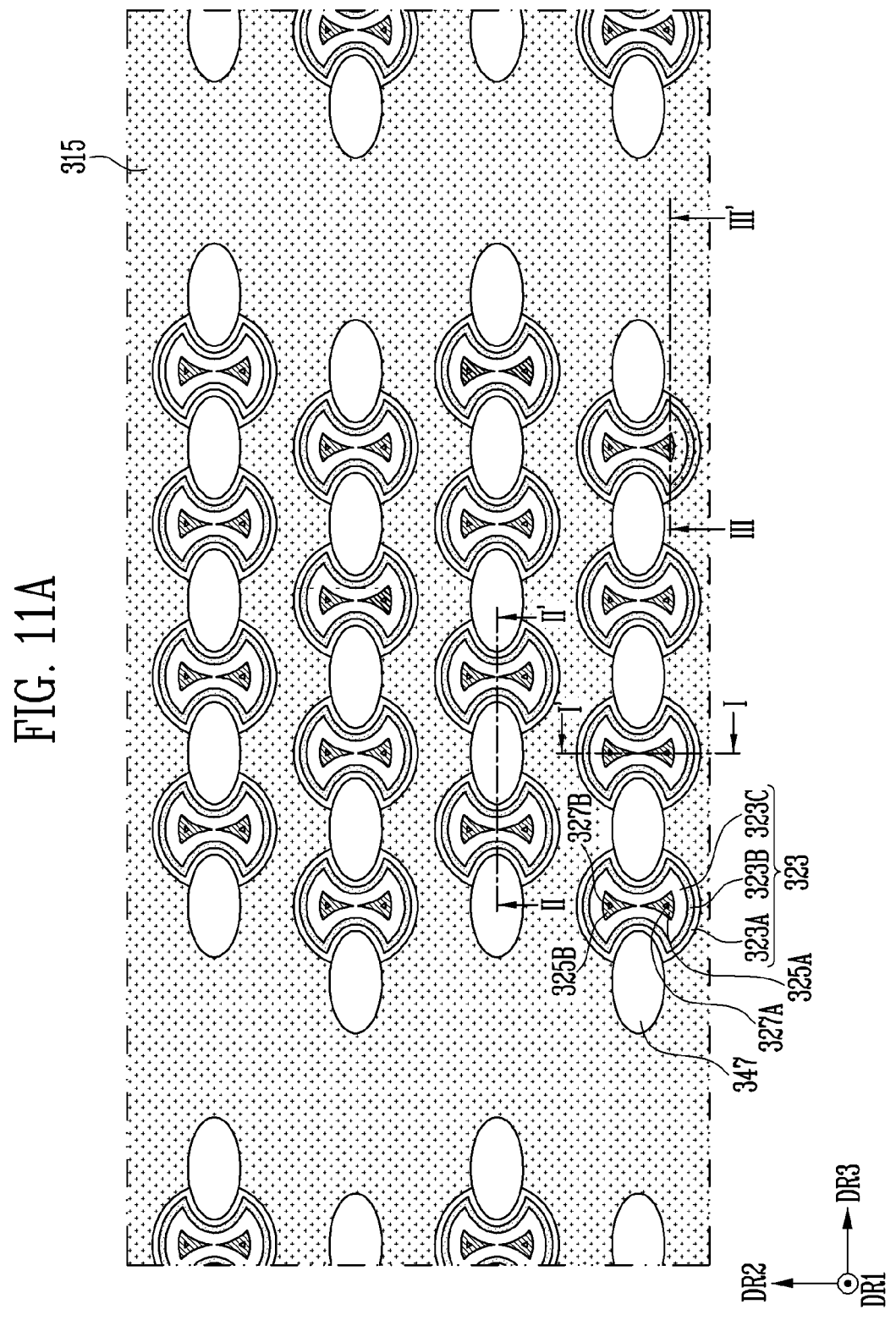
Figure 11B:
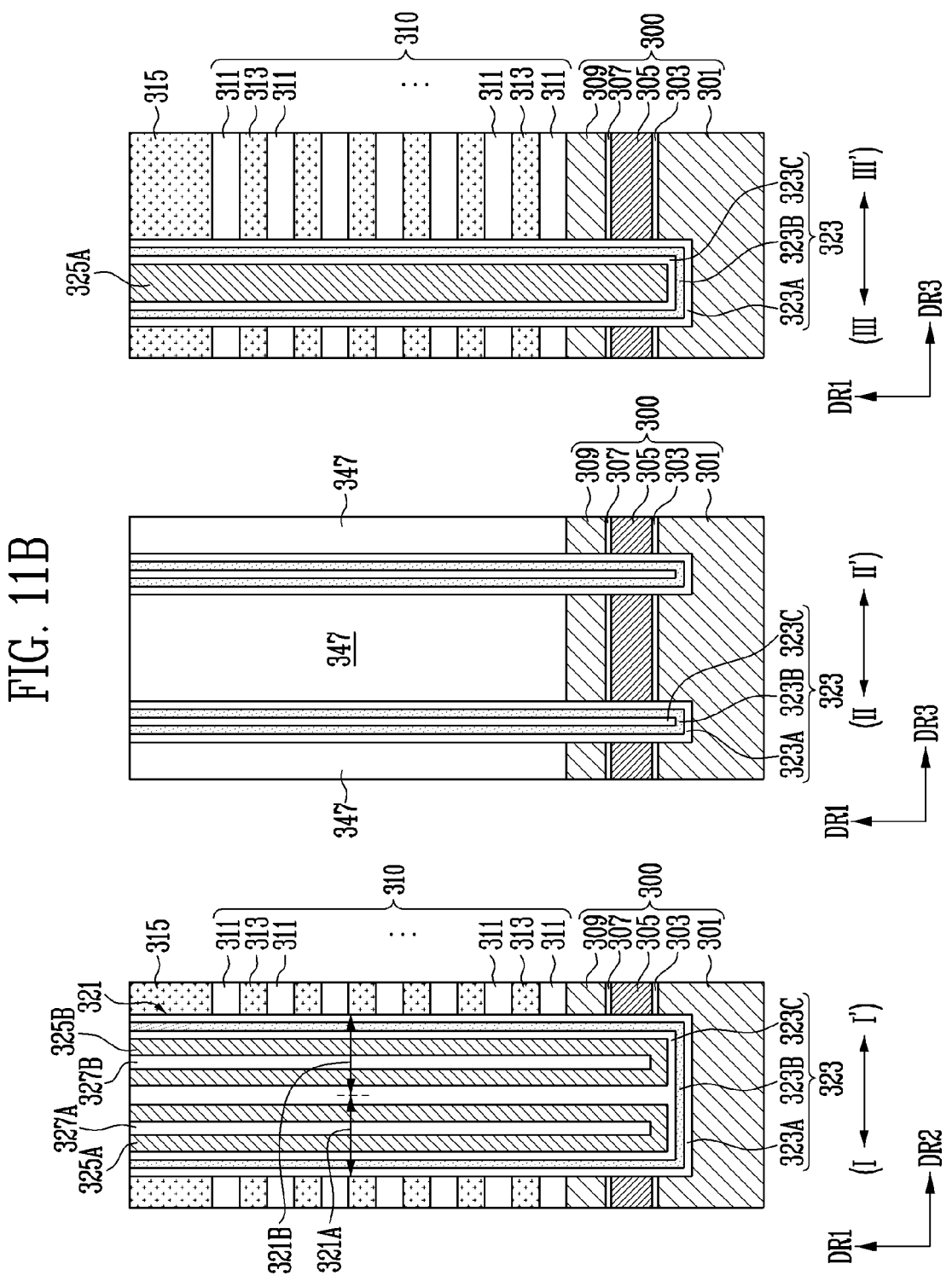

FIGS. 11A and 11B are plan and sectional views illustrating a subsequent process performed after the process, shown in FIGS. 10A and 10B. FIG. 11B illustrates sectional views taken along lines I-I', II-II', and III-III' shown in a plan view, shown in FIG. 11A.

Referring to FIGS. 11A and 11B, the plurality of auxiliary holes 345, shown in FIG. 10B, may be respectively filled with a plurality of insulating pillars 347. Subsequently, the second mask pattern 341, shown in FIGS. 10A and 10B, may be removed, and portions of the preliminary channel layer 325 and the preliminary memory layer 323, which are shown in FIG. 10B, may be removed such that the mask layer 315 is exposed. Accordingly, the preliminary channel layer 325, shown in FIG. 10B, may be isolated into a first channel layer 325A and a second channel layer 325B. The first channel layer 325A may be disposed in the first part 321A of the hole 321, and the second channel layer 325B may be disposed in the second part 321B of the hole 321.

Figure 12A:
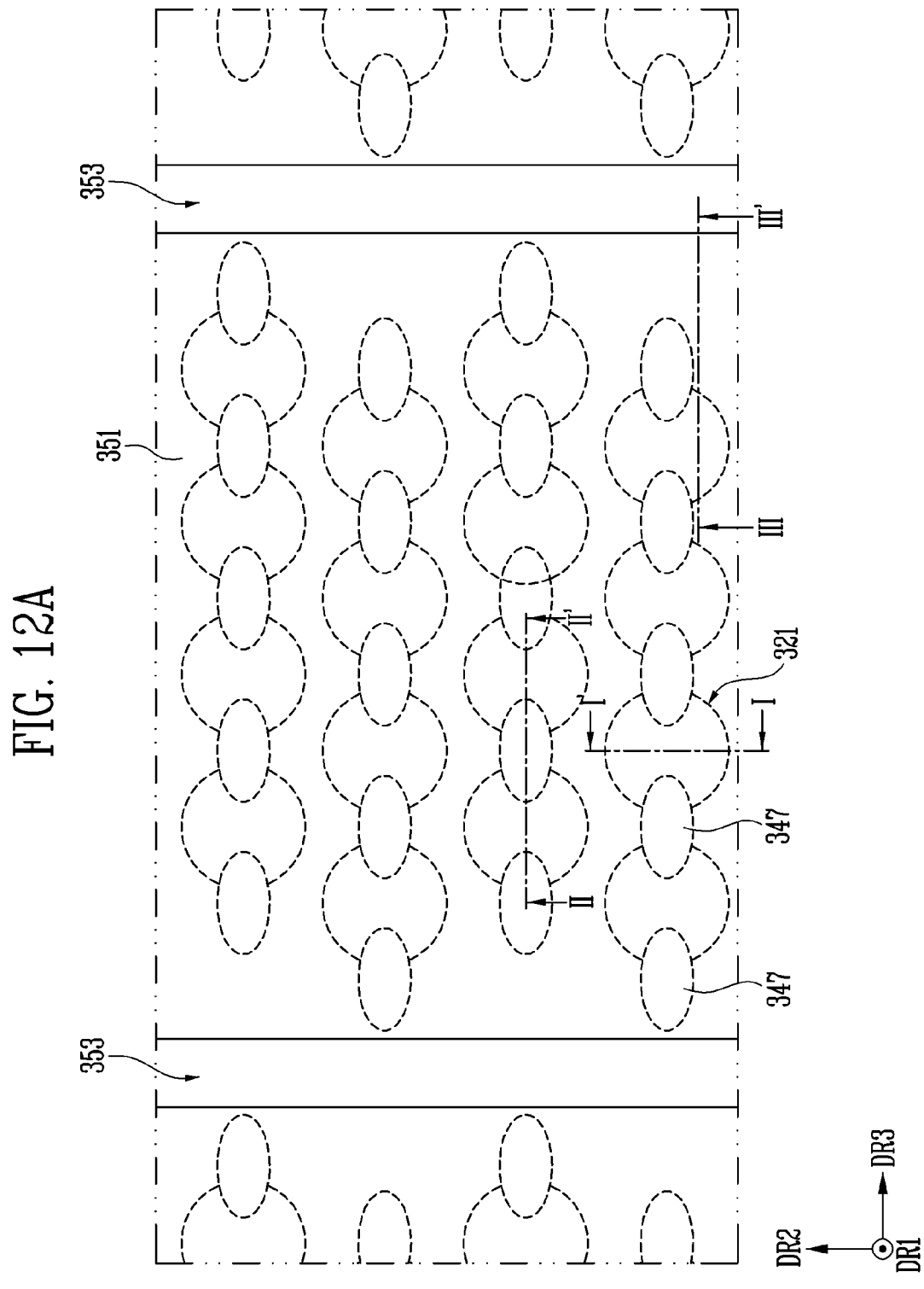
Figure 12B:
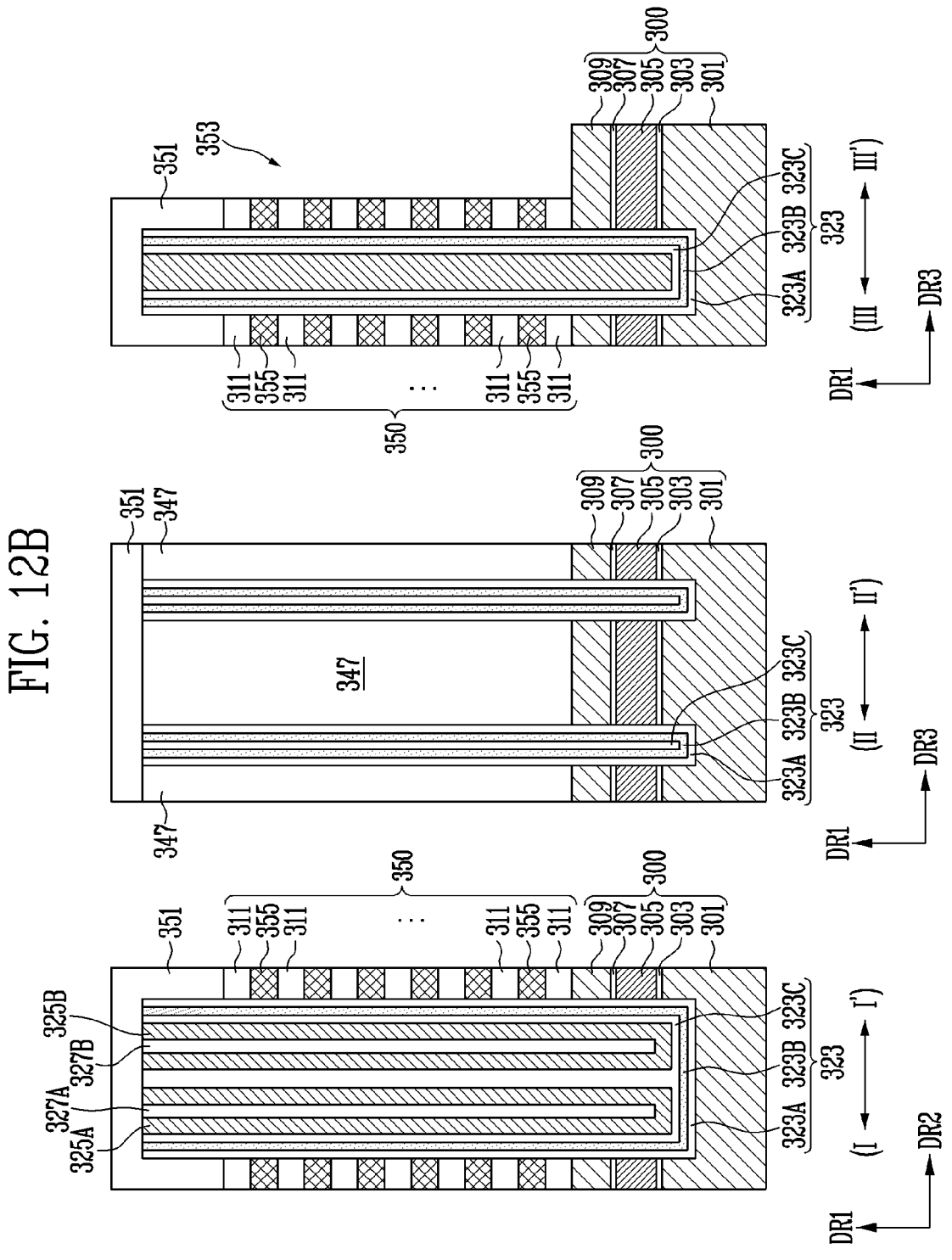

FIGS. 12A and 12B are plan and sectional views illustrating a process of forming a gate stack structure. FIG. 12B illustrates sectional views taken along lines I-I', II-II', and III-III' shown in a plan view shown in FIG. 12A.

Referring to FIGS. 12A and 12B, after the mask layer 315 shown in FIGS. 11A and 11B is removed, a first insulating layer 351 may be formed on the stack structure 310, shown in FIGS. 11A and 11B. The first insulating layer 351 may cover the first channel layer 325A, the second channel layer 325B, the preliminary memory layer 323, and the plurality of insulating pillars 347.

Subsequently, a slit 353 may be formed to penetrate the first insulating layer 351 and the stack structure 310, shown in FIG. 11B. The slit 353 may be spaced apart from the plurality of insulating pillars 347.

The plurality of first material layers 311 and the plurality of second material layers 313, which are shown in FIG. 11B, may be etched to form the slit 353. During the etching process for forming the slit 353, the etch stop layer 309 may be used to measure an etching end time. In an embodiment in which the first material layer 311, shown in FIG. 11B, is provided as an interlayer insulating layer and the second material layer 313, shown in FIG. 11B, is formed of a sacrificial material, the plurality of second material layers 313 may be replaced with a plurality of conductive layers 355 through the slit 353. Accordingly, a gate stack structure 350 may be formed, which includes a plurality of interlayer insulating layers (e.g., 311) and the plurality of conductive layers 355, and may be partitioned by the slit 353.

Figure 13:
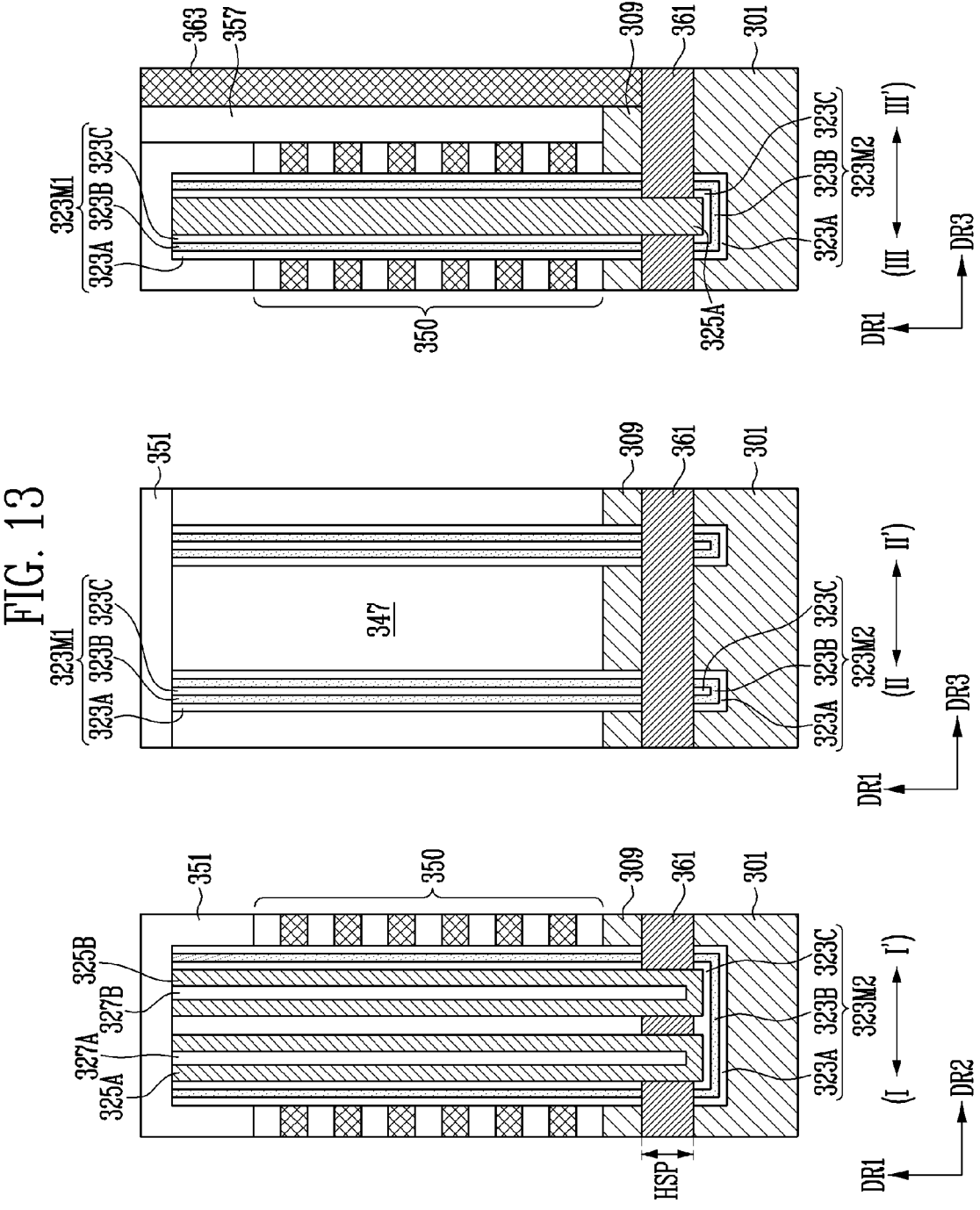
Figure 14:
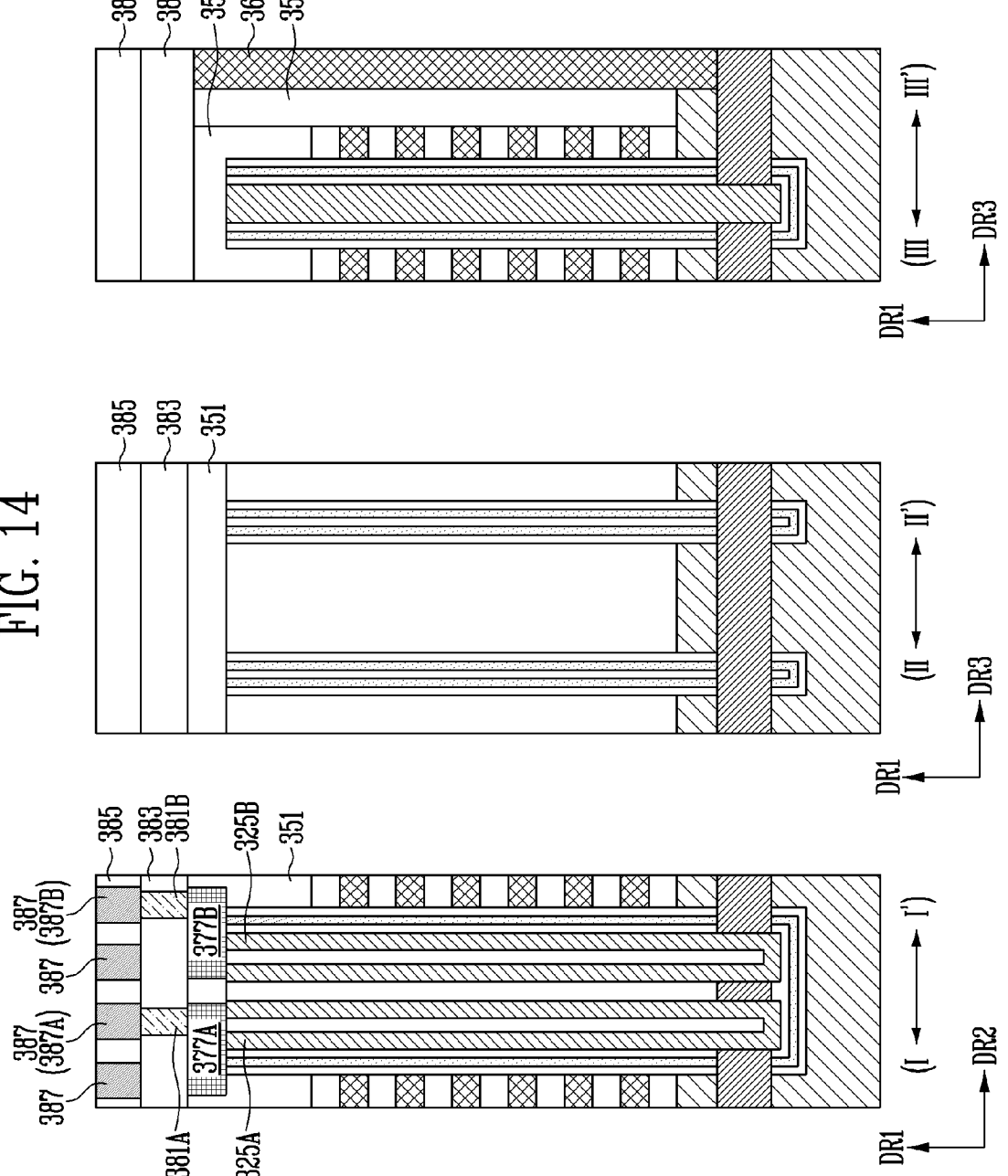

FIGS. 13 and 14 are sectional views illustrating an embodiment of subsequent processes continued after the process shown in FIGS. 12A and 12B.

Referring to FIG. 13, a sidewall insulating layer 357 may be formed on a sidewall of the slit 353, shown in FIG. 12B. Subsequently, a portion of the etch stop layer 309 and a portion of the second protective layer 307, shown in FIG. 12B, may be etched, thereby exposing the sacrificial layer 305, shown in FIG. 12B. Subsequently, the sacrificial layer 305 shown in FIG. 12B may be selectively removed. Accordingly, the first protective layer 303 and the second protective layer 307, which are shown in FIG. 12B, and the preliminary memory layer 323, shown in FIG. 12B, may be exposed. Subsequently, a portion of the preliminary memory layer 323, shown in FIG. 12B, may be removed to expose a sidewall of each of the first and second channel layers 325A and 325B. The first protective layer 303 and the second protective layer 307, which are shown in FIG. 12B, may be removed.

As described above, because the sacrificial layer 305, the first protective layer 303, and the second protective layer 307, which are shown in FIG. 12B, may be removed, and a portion of the preliminary memory layer 323, shown in FIG. 12B, may be removed, a horizontal space HSP may be formed between the etch stop layer 309 and the lower doped semiconductor layer 301. Each of the blocking insulating layer 323A, the data storage layer 323B, and the tunnel insulating layer 323C may be isolated into a memory layer 323M1 and a lower memory layer 323M2 by the horizontal space HSP. Subsequently, a doped semiconductor layer may be formed in the horizontal space HSP, so that a channel contact layer 361 that is connected between the first channel layer 325A and the second channel layer 325B is formed. Subsequently, a source contact structure 363 may be formed, which extends in the first direction DR1 from the channel contact layer 361.

Although not shown in the drawing, the line isolation structure 173, shown in FIG. 4A, may be formed after the gate stack structure 350 is formed.

Referring to FIG. 14, after a portion of the first insulating layer 351 that overlaps with the first channel layer 325A and the second channel layer 325B is etched, a region in which the first insulating layer 351 is etched may be filled with a conductive material. Accordingly, a first conductive pad 377A that is connected to the first channel layer 325A and a second conductive pad 377B that is connected to the second channel layer 325B may be formed.

Subsequently, a second insulating layer 383 may be formed on the first insulating layer 351. The second insulating layer 383 may extend to cover the first conductive pad 377A and the second conductive pad 377B. Subsequently, a portion of the second insulating layer 383 may be etched, thereby forming a first contact hole and a second contact hole, which respectively expose the first conductive pad 377A and the second conductive pad 377B. Subsequently, the first contact hole and the second contact hole may be filled with a conductive material. Accordingly, a first conductive contact 381A that is connected to the first conductive pad 377A and a second conductive contact 381B that is connected to the second conductive pad 377B may be formed.

Continuously, a third insulating layer 385 may be formed on the second insulating layer 383. The third insulating layer 385 may extend to cover the first conductive contact 381A and the second conductive contact 381B. Subsequently, a plurality of bit lines 387 may be formed, which penetrate the third insulating layer 385. The plurality of bit lines 387 may include a first bit line 387A that is connected to the first conductive contact 381A and a second bit line 387B that is connected to the second conductive contact 381B.

The semiconductor memory device described with reference to FIGS. 4A to 4D and 5A to 5C and the semiconductor memory device described with reference to FIG. 6A may be manufactured by using the processes described with reference to FIGS. 8A to 13.

FIGS. 15A, 15B, 16A, 16B, and 17 are views illustrating a manufacturing method of a semiconductor memory device in accordance with an embodiment of the present disclosure.

Figure 15A:
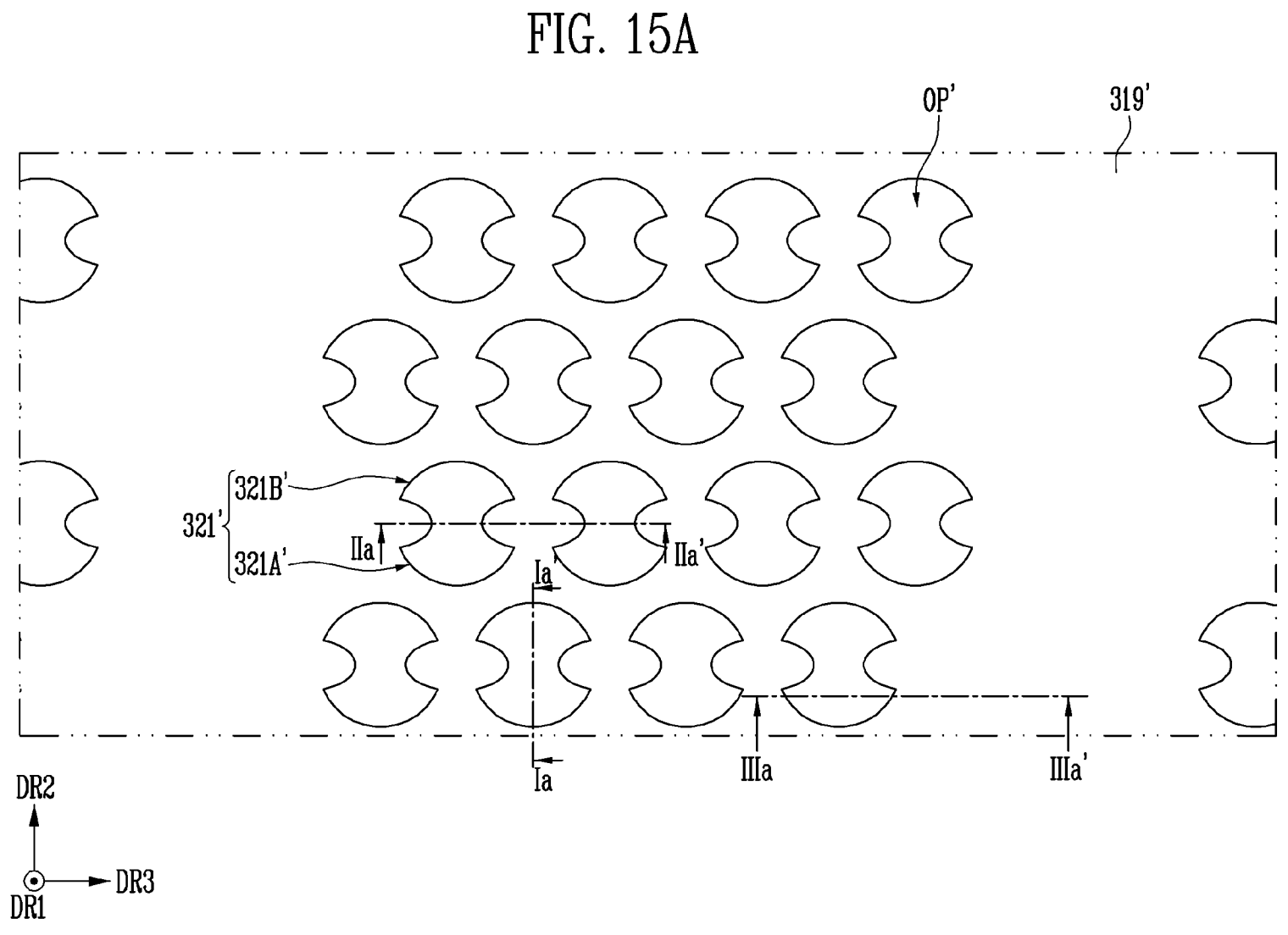
Figure 15B:
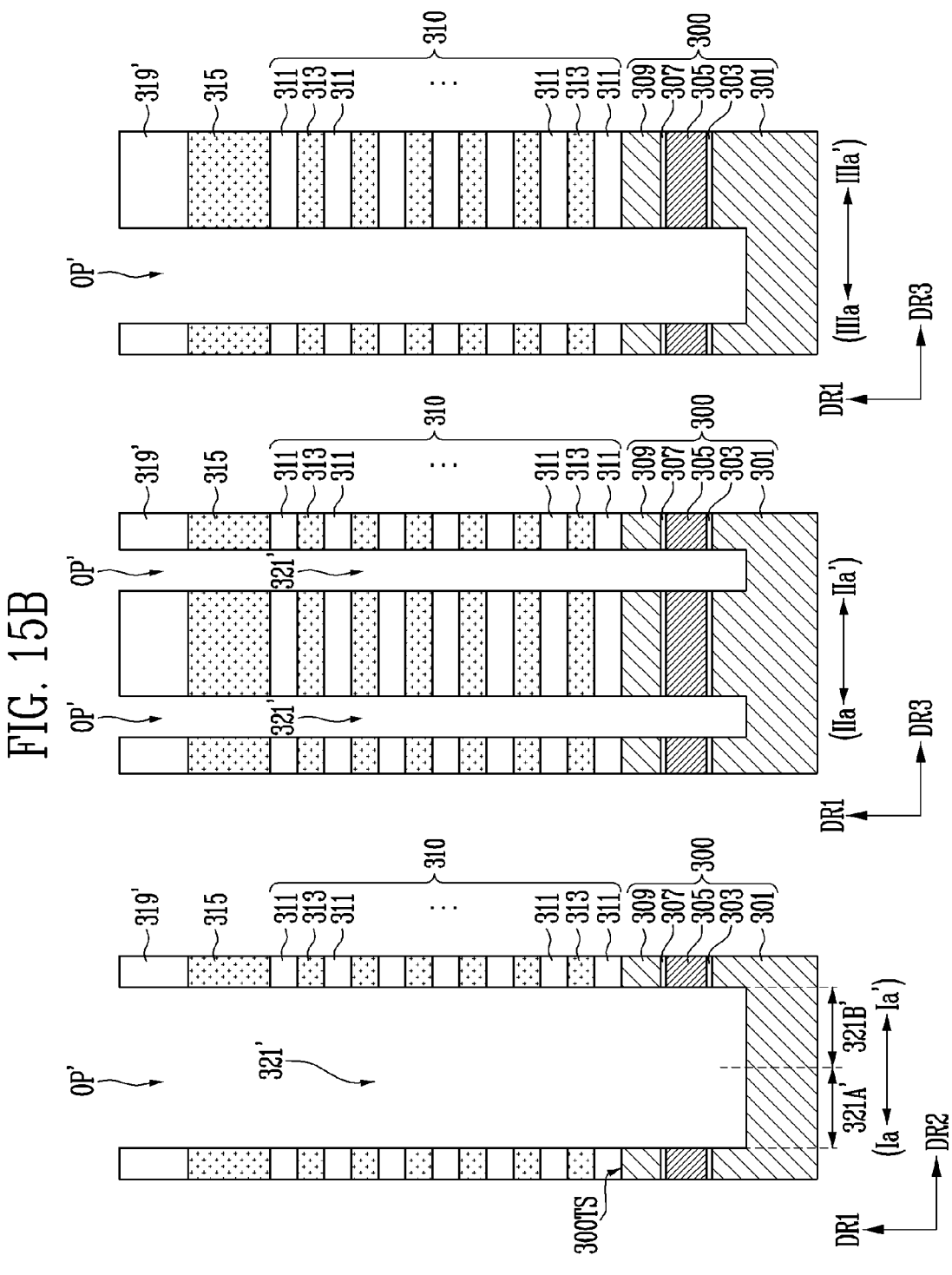

FIGS. 15A and 15B are views illustrating a process of forming a plurality of holes. FIG. 15B illustrates sectional views taken along lines Ia-Ia', IIa-IIa', and IIIa-IIIa' shown in a plan view shown in FIG. 15A.

Referring to FIGS. 15A and 15B, a plurality of holes 321' may be formed to penetrate a stack structure 310. The stack structure 310 may be formed over a lower structure 300. In an embodiment, the lower structure 300 may include a lower doped semiconductor layer 301, a first protective layer 303, a sacrificial layer 305, a second protective layer 307, and an etch stop layer 309 as described with reference to FIGS. 8A and 8B. The stack structure 310 may include a plurality of first material layers 311 and a plurality of second material layers 313 as described with reference to FIGS. 8A and 8B. As described with reference to FIGS. 8A and 8B, a mask layer 315 may be formed over the stack structure 310. The plurality of holes 321' may penetrate the mask layer 315.

The plurality holes 321' may be formed through an etching process by using a mask pattern 319' as an etch barrier. The mask pattern 319' may be formed over the mask layer 315 through a photolithography process. The mask pattern 319' may include a plurality of openings OP'. Each opening OP' may be formed in a butterfly shape. The plurality of holes 321' may be formed by etching a portion of the mask layer 315 and a portion of the stack structure 310, which are exposed through the plurality of openings OP' of the mask pattern 319'. Each hole 321' may extend into the lower doped semiconductor layer 301 as described with reference to FIGS. 9A and 9B.

The plurality of holes 321' may be formed in a shape corresponding to the plurality of openings OP' having the butterfly shape. More specifically, as described with reference to FIG. 4C, each hole 321' may include a first part 321A' and a second part 321B', which are adjacent to each other in the second direction DR2 in a plan view, on a plane parallel to a top surface 300TS of the lower structure 300, and may be connected to each other. As described with reference to FIG. 4C, the first part 321A' and the second part 321B' may have widths becoming narrower closer to a connection point.

The mask pattern 319' may be removed after the plurality holes 321' are formed.

Figure 16A:
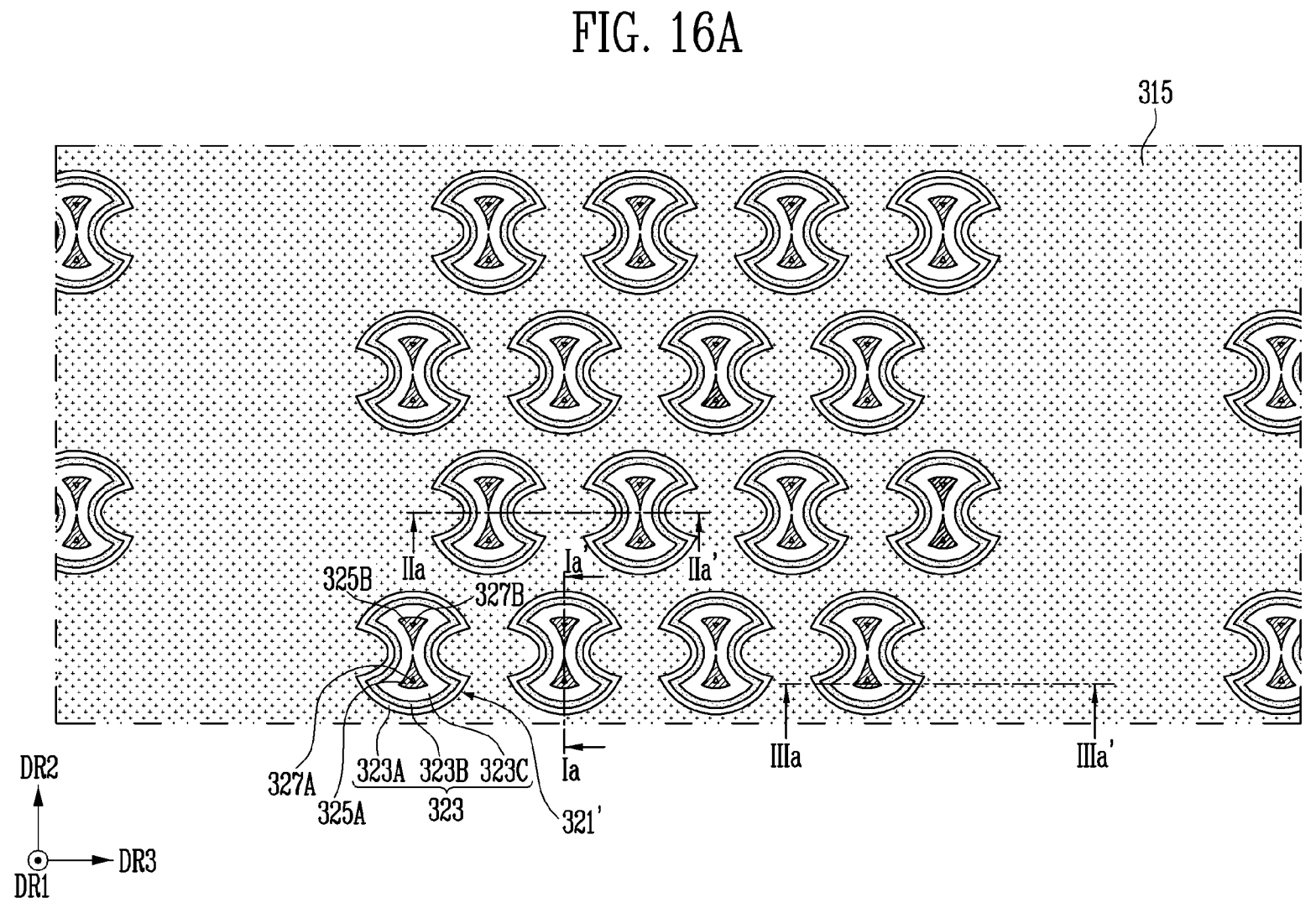
Figure 16B:
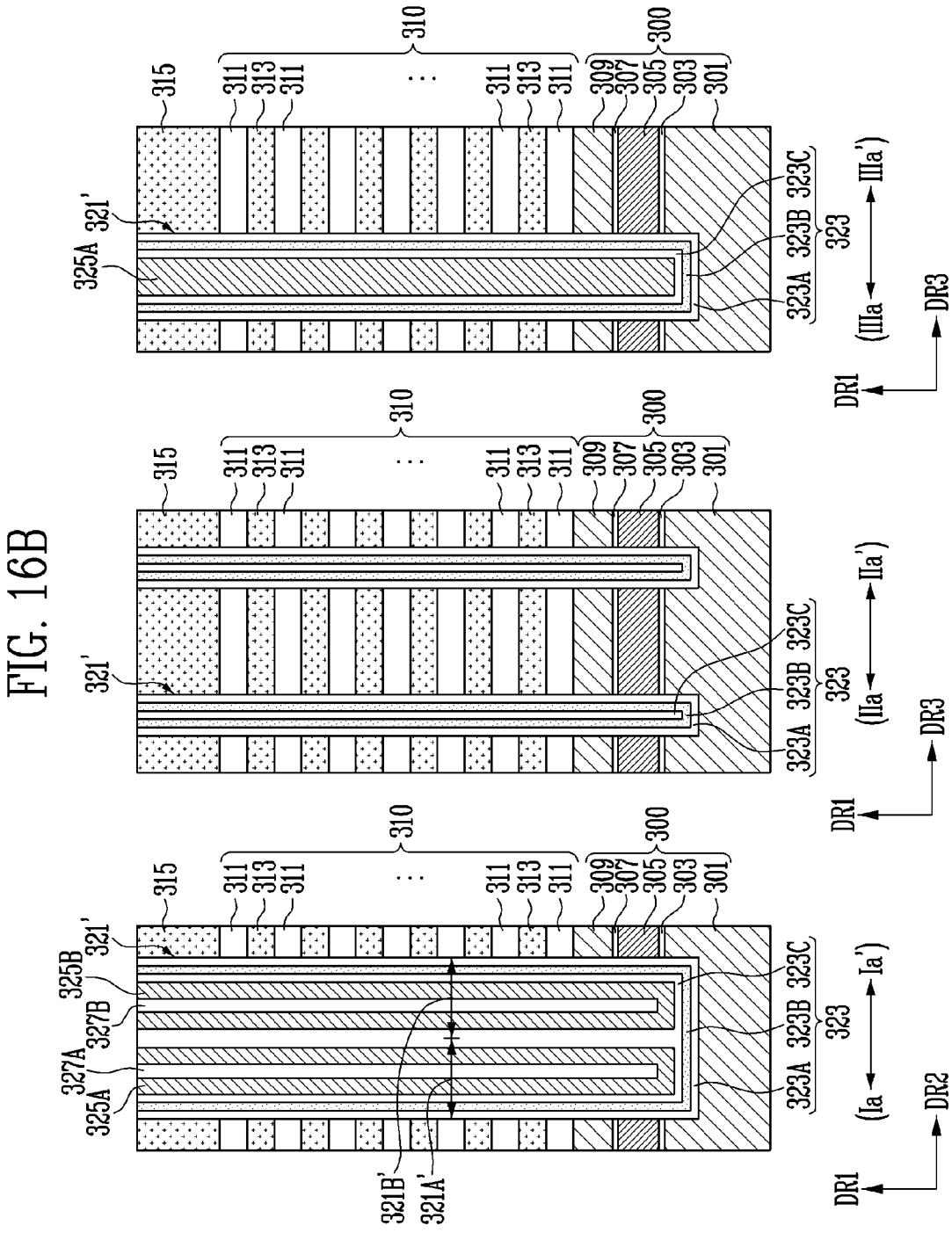

FIGS. 16A and 16B are views illustrating an embodiment of a subsequent process continued after the process shown in FIGS. 15A and 15B. FIG. 16B illustrates sectional views taken along lines Ia-Ia', IIa-IIa', and IIIa-IIIa' shown in a plan view shown in FIG. 16A.

Referring to FIGS. 16A and 16B, as described with reference to FIGS. 10A and 10B, a preliminary memory layer 323, a preliminary channel layer, a first core insulating layer 327A, and a second core insulating layer 327B may be formed in each of the plurality of holes 321'. At least one of a blocking insulating layer 323A, a data storage layer 323B, and a tunnel insulating layer 323C of the preliminary memory layer 323 may allow the first part 321A' and the second part 321B' of each hole 321' to be spaced apart from each other with respect to the connection point between the first part 321A' and the second part 321B'.

Subsequently, as described with reference to FIGS. 11A and 11B, portions of the preliminary channel layer and the preliminary memory layer may be removed such that the mask layer 315 is exposed. Therefore, the preliminary channel layer may be isolated into a first channel layer 325A in the first part 321A' and a second channel layer 325B in the second part 321B'. Subsequently, the mask layer 315 may be removed.

Figure 17:
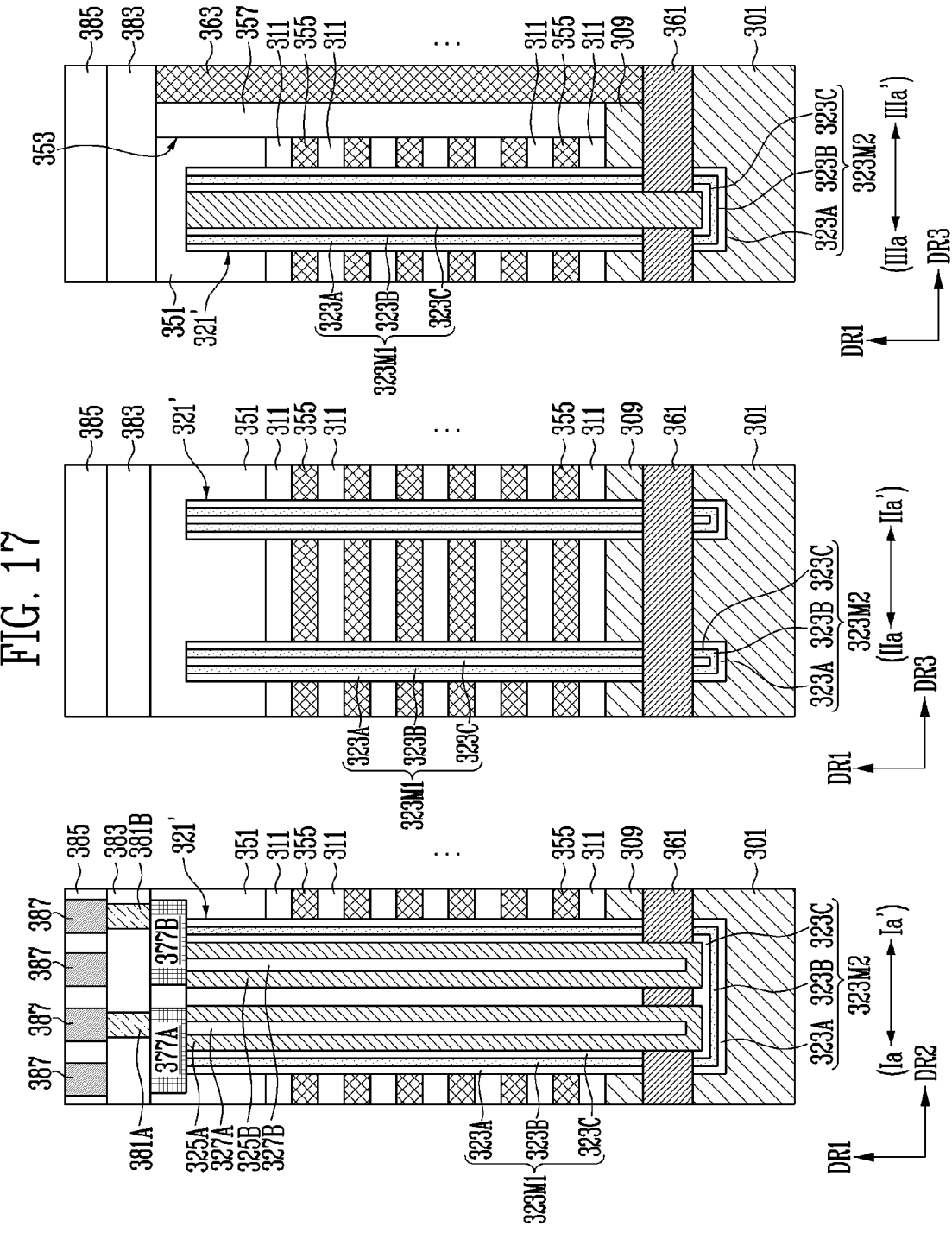

FIG. 17 is a sectional view illustrating a subsequent process continued after the process shown in FIGS. 16A and 16B.

Referring to FIG. 17, as described with reference to FIGS. 12A and 12B, a process of forming a first insulating layer 351, a process of forming a slit 353, and a process of a plurality of conductive layers 355 may be performed. The plurality of conductive layers 355 that are spaced apart from each other in the first direction DR1 may extend in the second direction DR2 and the third direction DR3 in each layer. Each conductive layer 355 may extend to a space between holes 321' that are adjacent to each other in the third direction DR3 and may surround a sidewall of the hole 321'.

Subsequently, a sidewall insulating layer 357 and a channel contact layer 361 may be formed by using the processes described with reference to FIG. 13. Each of the blocking insulating layer 323A, the data storage layer 323B, and the tunnel insulating layer 323C may be isolated into a memory layer 323M1 and a lower memory layer 323M2 by the channel contact layer 361. Subsequently, as described with reference to FIG. 13, a source contact structure 363 may be formed.

Subsequently, a first conductive pad 377A, a second conductive pad 377B, a second insulating layer 383, a first conductive contact 381A, a second conductive contact 381B, a third insulating layer 385, and a plurality of bit lines 387 may be formed by using the processes described with reference to FIG. 14.

The semiconductor memory device described with reference to FIGS. 6B and 6C may be formed by using the processes described with reference to FIGS. 15A to 17.

The semiconductor memory device, shown in FIG. 7, may be formed by using the processes described with reference to FIGS. 8A to 13 or the processes described with reference to FIGS. 15A to 17. The lower structure of the semiconductor memory device, shown in FIG. 7, may be formed as a sacrificial substrate, unlike the lower structure 300 described with reference to FIGS. 8A to 13 or the lower structure 300 described with reference to FIGS. 15A to 17.

The first bonding insulating layer 221 and the first conductive bonding pad 223 of the semiconductor memory device, shown in FIG. 7, may be formed after the processes described with reference to FIGS. 8A to 13 or the processes described with reference to FIGS. 15A to 17 are performed. The structure including the peripheral circuit structure 290, the second bonding insulating layer 251, and the second conductive bonding pad 253, shown in FIG. 7, may be provided through a process separated from the processes described with reference to FIGS. 8A to 13 or the process described with reference to FIGS. 15A to 17. The doped semiconductor structure DPS' of the semiconductor memory device, shown in FIG. 7, may be formed after the second bonding insulating layer 251 and the second conductive bonding pad 253 are bonded to the first bonding insulating layer 221 and the first conductive bonding pad 223. After the bonding process, a process of removing the lower structure and a process of exposing the first channel layer 125A and the second channel layer 125B, as shown in FIG. 7, may be performed. Subsequently, the doped semiconductor structure DPS', shown in FIG. 7, may be formed.

FIG. 18 is a block diagram illustrating a configuration of a memory system in accordance with an embodiment of the present disclosure.

Referring to FIG. 18, the memory system 1100 includes a memory device 1120 and a memory controller 1110.

The memory device 1120 may be a multi-chip package configured with a plurality of flash memory chips. The memory device 1120 may include a stack structure including a plurality of conductive layers, a hole formed in the stack structure, a memory layer allowing a first part and a second part of the hole to be spaced apart from each other in the hole, and a first channel layer disposed in the first part of the hole and a second channel layer disposed in the second part of the hole. The first channel layer and the second channel layer may be spaced apart from each other by the memory layer.

The memory controller 1110 may control the memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host that is connected with the memory system 1100. The error correction block 1114 may detect an error in a data read from the memory device 1120 and may correct the detected error. The memory interface 1115 may interface with the memory device 1120. The memory controller 1110 may further include a Read Only Memory (ROM) for storing code data for interfacing with the host, and the like.

The memory system 1100, configured as described above, may be a memory card or a Solid State Disk (SSD), in which the memory device 1120 is combined with the memory controller 1110. For example, when the memory system 1100 is an SSD, the memory controller 1110 may communicate with an external device (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

FIG. 19 is a block diagram illustrating a configuration of a computing system in accordance with an embodiment of the present disclosure.

Referring to FIG. 19, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211. The memory device 1212 may be configured in the same way as the memory device 1120 described above with reference to FIG. 18. The memory controller 1211 may be configured in the same way as the memory controller 1110 described above with reference to FIG. 18.

In accordance with various embodiments of the present disclosure, a space in a hole is isolated into a first region and a second region by a memory layer extending along a sidewall of the hole. Thus, although a channel layer in the hole is not isolated through a etching process, a first channel layer in the first region and a second channel layer in the second region may be isolated from each other by the memory layer. Accordingly, damage of the memory layer and the channel layer, which is caused by an etching process in the hole may be prevented, thereby improving the operational reliability of the semiconductor memory device.

What is claimed is:

1. A semiconductor memory device comprising:
   a stack structure including a plurality of conductive layers, each of the plurality of conductive layers having a surface facing a first direction and the plurality of conductive layers being spaced apart from each other in the first direction;
   a hole formed in the stack structure, the hole including a first part and second part that are adjacent to each other in a second direction that is perpendicular to the first direction, wherein the hole has a width that is narrower closer to a connection point between the first part and the second part;
   a first channel layer in the first part of the hole;
   a second channel layer in the second part of the hole; and
   a memory layer interposed between the first channel layer and the second channel layer and extending into a space between the stack structure and each of the first and second channel layers, and
   wherein the memory layer separates the first and second channel layers.

2. The semiconductor memory device of claim 1, further comprising a first insulating pillar and a second insulating pillar, penetrating the stack structure at both sides of the connection point between the first part and the second part of the hole.

3. The semiconductor memory device of claim 2, wherein the hole is concave in a region in contact with the first insulating pillar and the second insulating pillar.

4. The semiconductor memory device of claim 2, wherein the memory layer is formed along a sidewall of each of the first insulating pillar and the second insulating pillar to have a concave shape based on a contour of the first insulating pillar and the second insulating pillar.

5. The semiconductor memory device of claim 2, wherein, in the first direction, a length of each of the first channel layer and the second channel layer is greater than a length of each of the first insulating pillar and the second insulating pillar.

6. The semiconductor memory device of claim 1, wherein the plurality of conductive layers includes a protrusion part protruding toward the connection point.

7. The semiconductor memory device of claim 6, wherein the hole is concave in a region in contact with the protrusion part of the plurality of conductive layers.

8. The semiconductor memory device of claim 6, wherein the memory layer is formed along the protrusion part of the plurality of conductive layers.

9. The semiconductor memory device of claim 1, wherein edges of the first part and the second part of the hole overlap with an edge of a hypothetical circle.

10. The semiconductor memory device of claim 1, wherein edges of the first part and the second part of the hole overlap with an edge of a hypothetical ellipse.

11. The semiconductor memory device of claim 1, further comprising:

a first bit line connected to the first channel layer;

a second bit line connected to the second channel layer; and a doped semiconductor structure connected to the first channel layer and the second channel layer.

12. The semiconductor memory device of claim 1, further comprising a first core insulating layer and a second core insulating layer, wherein the first channel layer surrounds the first core insulating layer, and wherein the second channel layer surrounds the second core insulating layer.

13. A semiconductor memory device comprising:

a stack structure including a plurality of conductive layers that are spaced apart from each other;

a butterfly-shaped hole formed in the stack structure;

a memory layer extending along a sidewall of the butterfly-shaped hole, the memory layer isolating a first region and a second region in the butterfly-shaped hole;

a first channel layer in the first region; and a second channel layer in the second region, and wherein the memory layer separates the first and second channel layers.

14. The semiconductor memory device of claim 13, wherein the memory layer fills a central region of the butterfly-shaped hole between the first channel layer and the second channel layer and peripheral regions of the butterfly-shaped hole between the stack structure and each of the first channel layer and the second channel layer.

15. The semiconductor memory device of claim 13, further comprising an insulating pillar in contact with a concave portion of the butterfly-shaped hole, the insulating pillar penetrating the stack structure.

16. The semiconductor memory device of claim 15, wherein, in a stacking direction of the plurality of conductive layers, a length of each of the first channel layer and the second channel layer is greater than a length of the insulating pillar.

17. The semiconductor memory device of claim 13, wherein the plurality of conductive layers include a protrusion part protruding toward a concave portion of the butterfly-shaped hole.

18. The semiconductor memory device of claim 13, further comprising:

a first bit line connected to the first channel layer;

a second bit line connected to the second channel layer; and a doped semiconductor structure connected to the first channel layer and the second channel layer.

19. The semiconductor memory device of claim 13, further comprising a first core insulating layer and a second core insulating layer, wherein the first channel layer surrounds the first core insulating layer, and wherein the second channel layer surrounds the second core insulating layer.

* * * * *